United States Patent
Cohen et al.

(10) Patent No.: US 7,567,134 B2
(45) Date of Patent: *Jul. 28, 2009

(54) SYSTEM AND METHOD FOR SYNCHRONIZING MULTIPLE OSCILLATORS

(75) Inventors: Isaac Cohen, Dix Hills, NY (US);
Robert A. Neidorff, Bedford, NH (US);
Richard L. Valley, Nashua, NH (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

This patent is subject to a terminal disclaimer.

(21) Appl. No.: 11/799,181

(22) Filed: May 1, 2007

(65) Prior Publication Data
US 2007/0262823 A1    Nov. 15, 2007

Related U.S. Application Data

(60) Provisional application No. 60/796,420, filed on May 1, 2006.

(51) Int. Cl.
*H03B 27/00* (2006.01)
(52) U.S. Cl. .......................... 331/45; 331/57; 331/1 A; 331/2
(58) Field of Classification Search ............. 331/34, 331/16, 45, 2, 1 A, 57
See application file for complete search history.

(56) References Cited

U.S. PATENT DOCUMENTS

| 5,793,191 A | 8/1998 | Elmore et al. | |
|---|---|---|---|
| 2007/0253223 A1* | 11/2007 | Neidorff et al. | 363/2 |
| 2007/0253224 A1* | 11/2007 | Cohen et al. | 363/9 |

OTHER PUBLICATIONS

Infineon Technologies, CCM-PFC, ICE1PCS01, *Standalone Power Factor Correction (PFC) Controller in Continuous Conduction Mode (CCM)*, Datasheet, V1.3, Feb. 6, 2007.
On Semiconductor Publication NCP1601A, NCP1601B, *Compact Fixed Frequency Discontinuous or Critical Conduction Voltage Mode Power Factor Correction Controller*, Semiconductor Components Industries, LLC, Dec. 2005.
ST, L6563, *Advanced transition-mode PFC controller*, STMicroelectronics, Mar. 2007.
Fairchild Semiconductor Corporation, Application Note AN-6026, *Design of Power Factor Correction Circuit Using FAN7529*, Oct. 16, 2006.

* cited by examiner

*Primary Examiner*—Arnold Kinkead
(74) *Attorney, Agent, or Firm*—John J. Patti; Wade J. Brady, III; Frederick J. Telecky, Jr.

(57) ABSTRACT

A system and method for synchronizing an oscillator with multiple phases at a desired phase angle difference. A relative measure of a phase angle difference between two phases permits each phase to be controlled to obtain the desired phase angle difference. The various phases may have different inherent frequencies that are synchronized to a common frequency such as an average of the different frequencies.

22 Claims, 14 Drawing Sheets

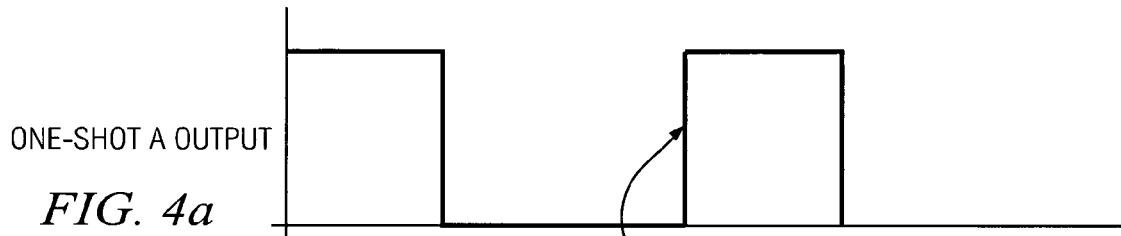
ONE-SHOT A OUTPUT
FIG. 4a
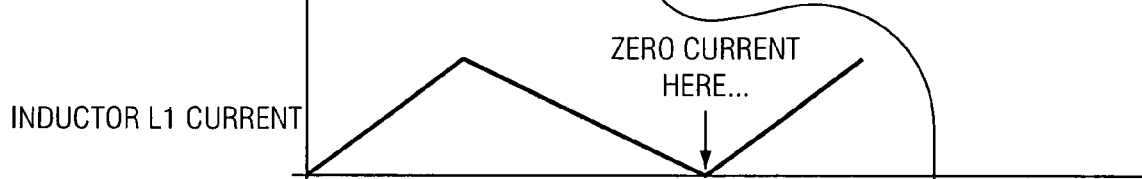
INDUCTOR L1 CURRENT
FIG. 4b
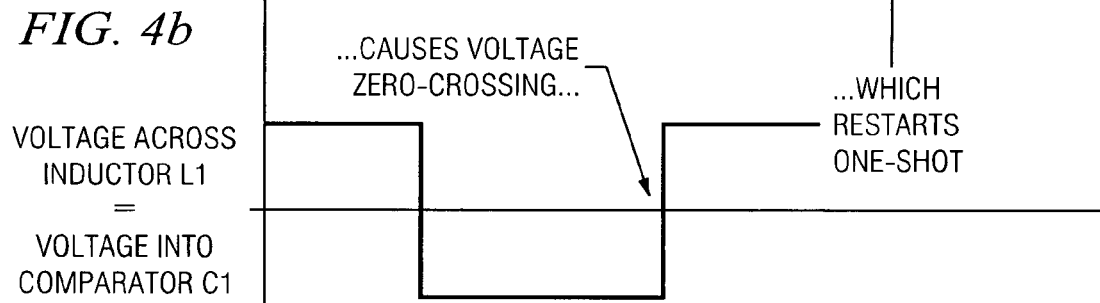
VOLTAGE ACROSS INDUCTOR L1 = VOLTAGE INTO COMPARATOR C1
FIG. 4c
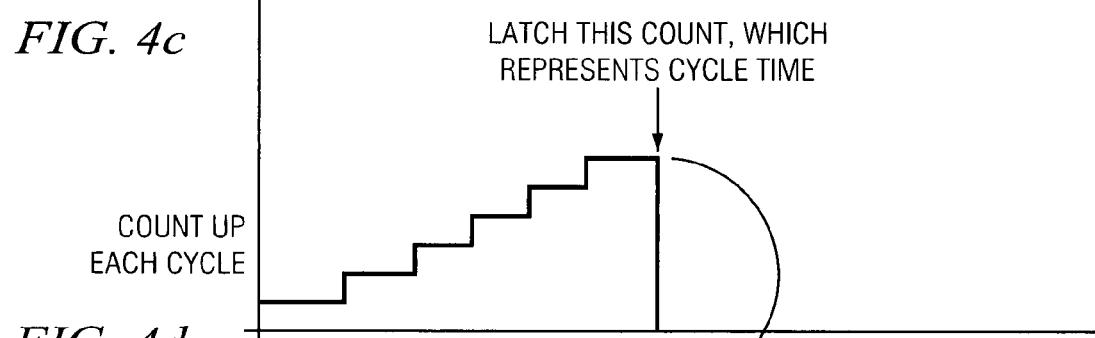
COUNT UP EACH CYCLE
FIG. 4d
DELAY HALF OF THAT CYCLE TIME
FIG. 4e
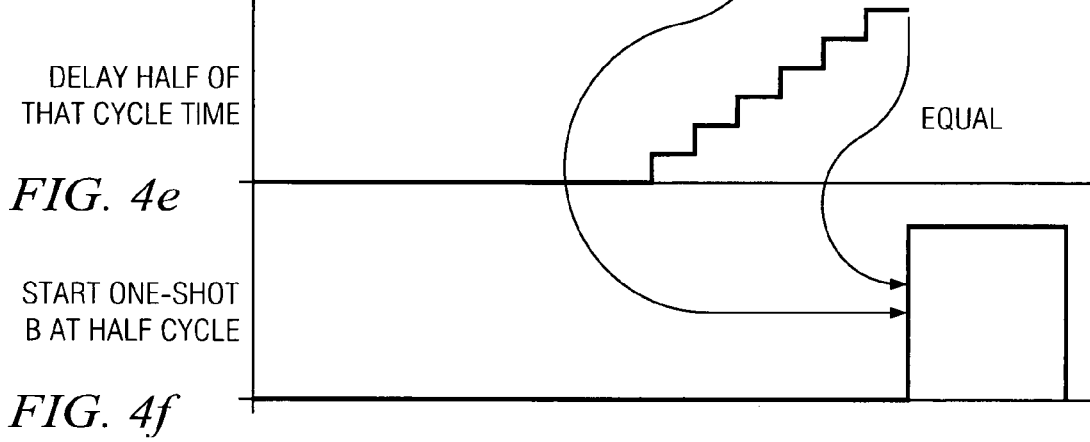
START ONE-SHOT B AT HALF CYCLE
FIG. 4f

Q1, Q2, Q3 -- FF STATES

SYSTEM AND METHOD FOR SYNCHRONIZING MULTIPLE OSCILLATORS

CROSS REFERENCE TO RELATED APPLICATIONS

This application is based on and claims benefit of U.S. Provisional Application No. 60/796,420, filed May 1, 2006. This application is related to U.S. application Ser. No. 11/799,352 (TI-61712) filed May 1, 2007, U.S. application Ser. No. 11/799/190 (TI-63804) filed May 1, 2007, and U.S. application Ser. No. 11/708,820 (TI-62124),filed Feb. 21, 2007.

STATEMENT REGARDING FEDERALLY SPONSORED RESEARCH OR DEVELOPMENT

Not Applicable

BACKGROUND OF THE INVENTION

1. Field of the Invention

The present invention relates generally to a system and method for synchronization of multiple oscillators, and relates more particularly to synchronization independent oscillators with periodic waveforms to obtain a multiphase oscillator.

2. Description of Related Art

A number of applications call for synchronization of phases in a multiphase system. Various types of power and communication systems, for example, include oscillators oscillating at a particular frequency or providing signals over a particular time interval to achieve the goals of the given system.

One example of a system in which various phases are synchronized to achieve better system performance is an interleaved multiphase switching power supply. When the various phases of the switching power supply are properly synchronized, advantages such as reduced input current ripple, reduced peak output current and higher frequency output ripple current can be obtained. The higher frequency output ripple current permits easier filtering of the output current to remove the ripple component to produce a well-regulated DC output.

It can be particularly challenging to synchronize multiple phases of such a switching power converter when a switching power converter is a variable frequency switching power supply. The various phases of the variable frequency switching power supply act as free running oscillators, the frequency of which is controlled by the amplitude of voltages or currents switched in the various phases. As load demand changes, switching frequency changes for each of the phases and maintaining synchronization of the phases in all situations can be difficult.

In addition, the synchronization of phases to obtain a desired phase angle separation depends upon the number of phases that are paralleled together. For example, if a multiphase system, such as the above-described switching power supply, has two phases, the phase angle difference between the waveforms in each phase should be 180°. For a three-phase system, the phase angle difference between the waveforms in each phase should be 120°. In general, the phase angle separation between the waveforms in each of the phases is equal to 360°/N, where N is the number of phases in the multiphase system.

One way to correct for mismatch in phase separation is to employ a Phase Locked Loop (PLL) to maintain an appropriate phase angle separation. Such a concept is illustrated in U.S. Pat. No. 5,793,191, where a slave stage of a power converter is maintained 180° out of phase with a master power converter stage. This arrangement calls for special purpose components that can add to power converter cost, complexity and size. One drawback to this approach is the challenge of acquiring and maintaining a phase lock over a wide range of conditions. The PLL capture range must encompass the difference between the free-running frequencies of the master and slave(s), which may prove difficult or costly in practice. For example, if a change in load demand causes switching frequency to change rapidly, a large momentary frequency error may result, which can cause loss of phase lock.

SUMMARY OF THE INVENTION

Briefly stated, the present disclosure provides a system and method for synchronizing multiple phases at a desired phase angle difference. A relative measure of a phase angle difference between two phases permits each phase to be controlled to obtain the desired phase angle difference. A phase angle difference detector may be provided for each phase. The various phases may have different inherent frequencies, the waveforms of which are synchronized to a given common, or average, frequency. The result is a multiphase oscillator with synchronized waveforms and a common frequency.

According to one embodiment, the disclosure provides an oscillator with two interleaved phases having periodic waveforms. The oscillator may include one or more waveform generators to control generation of the periodic waveforms. In addition, a phase detector is coupled to one or more of the waveform generators to generate an indication of a phase angle difference between the periodic waveforms. The waveform generator is responsive to the indication to control the generation of both periodic waveforms to form a desired phase angle difference between the periodic waveforms.

The multiphase oscillator may have another phase detector coupled to a waveform generator to generate another indication of another phase angle difference. The waveform generator is responsive to one indication to control generation of one of the periodic waveforms and is responsive to the other indication to control generation of another periodic waveform. The waveform generator causes the desired phase angle difference to be formed based on a relative relationship between the periodic waveforms. According to one exemplary aspect of the disclosed concept, the indication of the phase angle difference contributes to proportioning a rise or fall time of a corresponding periodic waveform.

Two or more waveform generators may be used to generate the periodic waveforms. Each waveform generator is responsive to a separate indication of a relative phase angle difference between periodic waveforms of different phases. The relative phase angle difference is a differential measure between cycles of periodic waveforms of different phases, as measured from one phase to the other, using either phase as the starting point. The relative phase angle difference can thus be a measure from a first phase to another, a measure from another phase to the first, or both. The use of both relative measures provides additional control freedoms to help speed the relative synchronization of the phases at a desired phase angle difference. The phase angle difference may be determined, for example, by measuring a time interval between cycle start points of the periodic waveforms of two different phases.

The relative phase angle difference can be a measure between two different phases that are not necessarily consecutively ordered in time. For example, the differential measure between cycles may be drawn between phases 2 and 5 in a six phase system, or between any combination of phases. The relative phase angle difference offers a relative measure between two of the phases, taken from the perspective of either phase, to contribute to controlling the respective periodic waveforms to have a desired phase angle difference.

The phase detector may include a device used to measure an interval between cycles of periodic waveforms of different phases. For example, a capacitor, counter or timer may be provided in the phase detector to contribute to producing the indication of phase angle difference.

A feedback signal representative of the periodic waveform in a phase may be provided to a respective waveform generator to contribute to controlling generation of the periodic waveforms. The feedback signal may indicate, for example, when a switching event should occur to achieve desired parameters for an application involving the multiphase oscillator, such as a multiphase switching power supply application.

According to another exemplary embodiment, the disclosure provides a multiphase oscillator with a plurality of interleaved phases having periodic waveforms that are synchronized. The oscillator includes one or more waveform generators that provide periodic signals used to generate the periodic waveforms. One or more phase detectors coupled to the waveform generator(s) provide an indication of a relative time interval between cycles of two of the periodic signals provided by the waveform generator(s). The waveform generator(s) is (are) responsive to the indication to modify the periodic signals to control or modify the generation of the periodic waveforms such that the periodic waveforms have a desired phase angle difference.

According to another exemplary embodiment of the present disclosure, a method of synchronizing a multiphase oscillator that has a plurality of interleaved phases synchronizes the periodic waveforms in the phases to a desired phase angle difference. The method includes generating a plurality of periodic signals to form the periodic waveforms. An indication of a relative time interval between cycles of at least two of the periodic signals that are each associated with a different phase is obtained. Based on the indication, the at least two periodic signals are controlled or changed to modify the generation of the periodic waveforms such that the periodic waveforms have a desired phase angle difference.

According to another exemplary embodiment, the present disclosure provides a multiphase oscillator with a first and a second waveform generator to generate a first and a second periodic waveform representative of a first and a second phase. A first and a second phase detector are coupled to the first and second waveform generators, respectively, and provide a first and a second indication of a relative time interval between a cycle of a respective periodic waveform and a cycle of another periodic waveform from a different phase. The first and second waveform generators are responsive to the respective first and second indications to influence the generation of the respective first and second periodic waveforms to form a desired phase angle difference between the respective periodic waveforms.

According to an embodiment of the present invention, the phases of a two-phase oscillator are synchronized by monitoring cycle start points for each phase. The cycle start points contribute to determining a relative phase difference between the phases. The duration of a period for the cycles of each phase is adjusted to synchronize frequencies and obtain a desired phase angle difference.

In accordance with a feature of the present disclosure, there is provided a system and method for synchronizing two or more phases in a multiphase oscillator based on detection of a zero crossing of a given phase. Synchronization based on detection of a zero crossing permits a simplified logic construct that can indicate the start of a subsequent phase. An oscillator output feedback error signal may contribute to adjustment of the phase separation.

According to one embodiment, a cycle length is measured for a phase in a two phase system. The measurement is divided in half to mark the point at which the other phase of the two-phase system should begin. By setting the second phase to begin at a halfway point for the first phase cycle, the two phases are maintained 180° apart.

According to another exemplary embodiment, a phase match filter provides signals for adjusting phase separation based on zero crossing points of the phase cycle. The system provides phase adjustments based on event timing, that is, zero crossings, in conjunction with the phase match filter. The system operates based on a combination of continuous and digital signals, so that both analog and digital inputs are accepted for driving the separate oscillators of the various phases. A digital control for the phase adjustment system decreases circuit complexity and cost.

In an embodiment featuring a two-phase oscillator, a periodic waveform in each of the phases is monitored and adjusted with respect to the other phase. The periodic waveforms are control signals that are used to drive switches that operate to increase and decrease a value for a component. The component may be a counter, capacitor, inductor, or other well-known devices that can maintain a value that can be increased or decreased. A new period in each phase begins when the respective component value reaches zero. Control of intervals for increasing or decreasing the value, is influenced by a phase control circuit and a feedback signal for each of the phases. Each of the phases is adjusted by a phase adjuster by shortening or lengthening a cycle of the waveform representing each of the phases. The adjustment may be made by shortening or lengthening an interval for increasing or decreasing the respective component value. The phase adjuster influences the feedback signal controlling the shape of the periodic waveform in the corresponding phase, based on information from the other phase. The phase adjuster modifies the shape of the periodic waveform to urge the operating phase difference toward a desired phase difference.

In another embodiment featuring an exemplary three-phase oscillator, the phase angle relationship between the phases is controlled based on period information and a phase angle difference between each of the three phases. Compared to a given phase, the cycle period of another phase is adjusted based on an arrangement of a plurality of phase angle difference measurement circuits and a plurality of phase feedback signals. Each of the plurality of phase feedback signals is influenced by an output of at least one of the plurality of phase angle difference measurement circuits to contribute to controlling a periodic waveform value in the respective phase. The control of the periodic waveform urges the operating phase angle difference toward a desired phase angle difference.

The disclosed multiphase oscillator can be extended to process more than three phases with relatively straight forward modifications. For example, an additional phase detector is provided with each added phase to achieve the present invention.

BRIEF DESCRIPTION OF THE DRAWINGS

FIGS. 4*a*-4*f* are graphs illustrating waveforms for the circuit of FIG. 3;

DETAILED DESCRIPTION OF THE INVENTION

This application claims the benefit of U.S. Provisional Application No. 60/796,420, filed May 1, 2006, the entire content of which is hereby incorporated herein by reference.

Figure 1A:
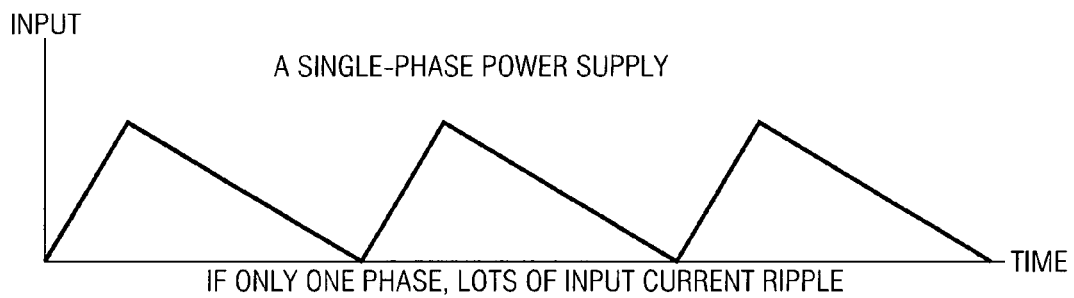
FIGS. 1a-1d are a set of graphs illustrating waveforms for an exemplary application for a synchronized multiphase oscillator.
Figure 1B:
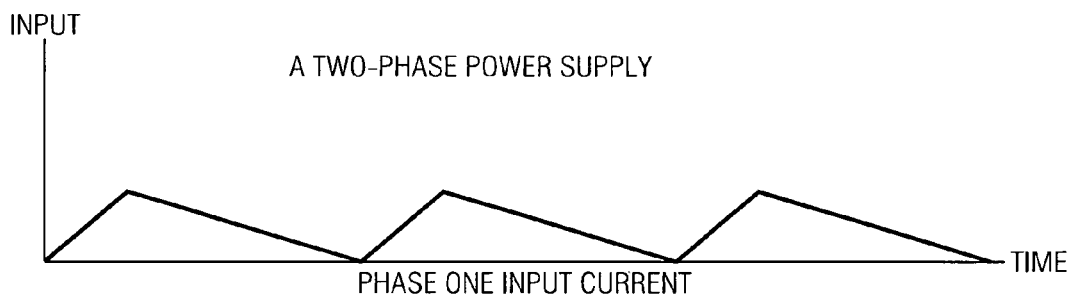
Figure 1C:
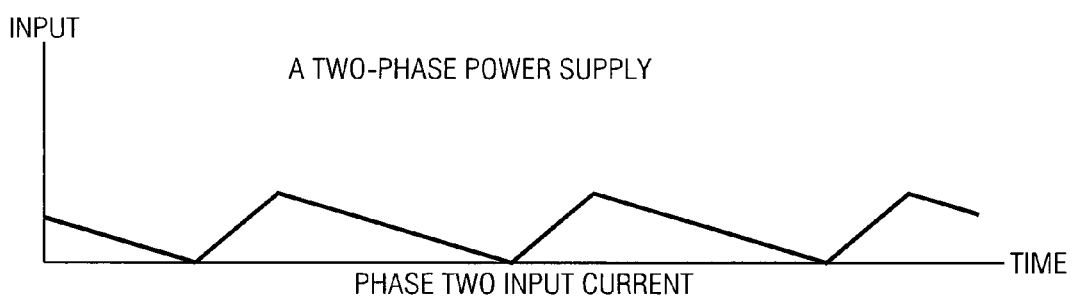
Figure 1D:
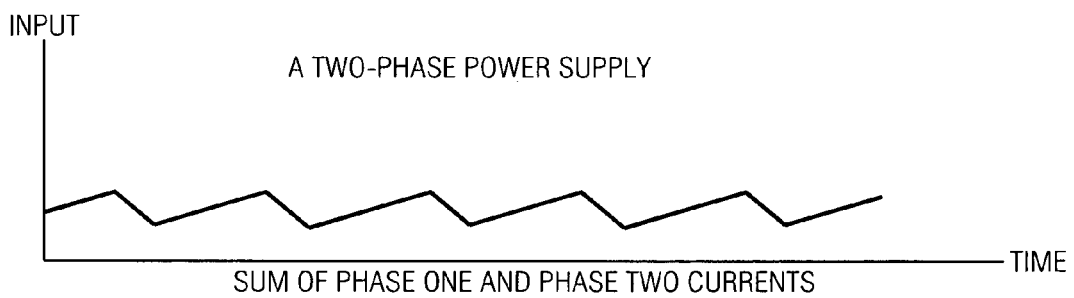

Referring to FIGS. 1*a*-1*d*, an illustration of aspects of an application for a synchronized multiphase oscillator is shown. The application is a multiphase interleaved, variable frequency switching power supply. In such an application, multiple boost power converters are paralleled and interleaved with synchronized phases to obtain improved performance over operation of a single boost power converter. Plots of input current verses time are illustrated for a single phase power supply and a power supply with two interleaved phases. FIG. 1*a* illustrates a single phase power supply that exhibits a significant amount of input current ripple. FIGS. 1*b*-1*d* illustrate input current for each of two phases, and the sum of the current of the two phases, respectively. The sum of the two current phases shown in FIG. 1*d* has a lower peak current, lower ripple, and a ripple frequency that is twice the frequency of the two input current phases. A variable frequency PWM control may be used to produce an interleaved multiphase power supply with such an advantageous summed current. One challenge in realizing a variable frequency PWM control is properly synchronizing the separate phases when the phases vary in frequency.

Figure 2A:
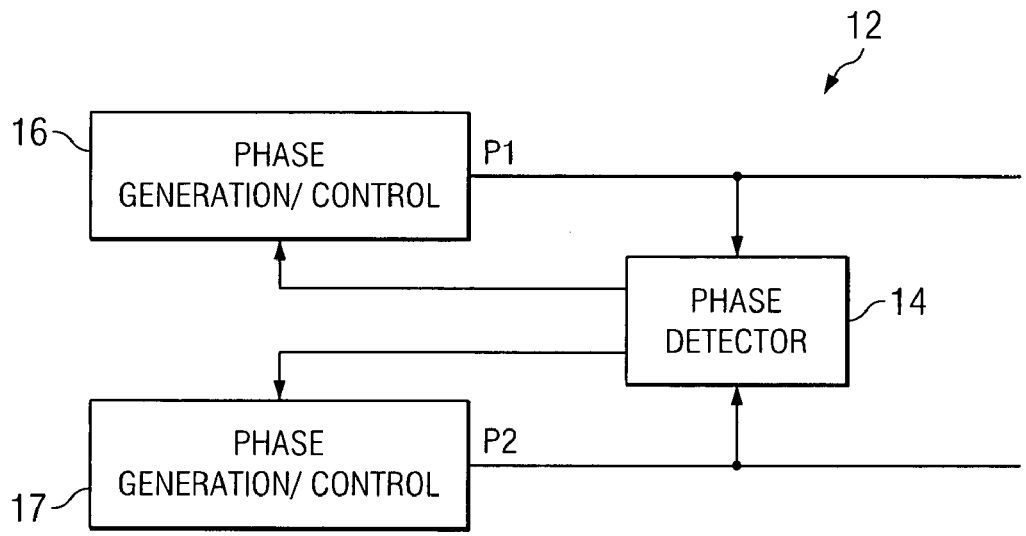
FIGS. 2a-2b are block diagrams illustrating phase synchronization architectures of the present invention.

Referring to FIG. 2*a*, an abstract block diagram of an interleaved multiphase oscillator 12 is illustrated. Oscillator 12 includes two phases, P1 and P2, that have periodic waveforms controlled to have a phase difference of 180°. A phase detector 14 inspects the waveforms of phases P1 and P2 and provides relative phase information to phase generation/control components 16, 17. Phase detector 14 provides a relative phase measure to each component 16, 17, based on phase information derived from an alternate phase. Accordingly, phase detector 14 inspects the periodic waveform of phase P2 to provide phase information to component 16, and inspects the periodic waveform of phase P1 to provide phase information to component 17. Each of components 16, 17 modify phases P1 and P2, respectively, based on the phase information provided by phase detector 14. As each of components 16, 17 modify their respective phases P1, P2, phase detector 14 provides further relative phase information feedback, thereby providing a closed loop relative phase angle difference control.

The periodic waveforms in phases P1, P2 may be power signals that are interleaved to produce a summed output with reduced peak current, reduced ripple, and higher frequency ripple, as discussed above with respect to FIGS. 1*a*-1*d*. Alternately, the periodic waveforms in phases P1 and P2 can be control signals provided to switching circuits or components that produce periodic power waveforms. In the exemplary configuration illustrated in FIG. 2*a*, a single phase detector 14 is provided for two phases P1 and P2. The configuration of FIG. 2*a* is a special case of the present invention involving two phases, the periodic waveforms of which are separated by 180°.

Figure 2B:
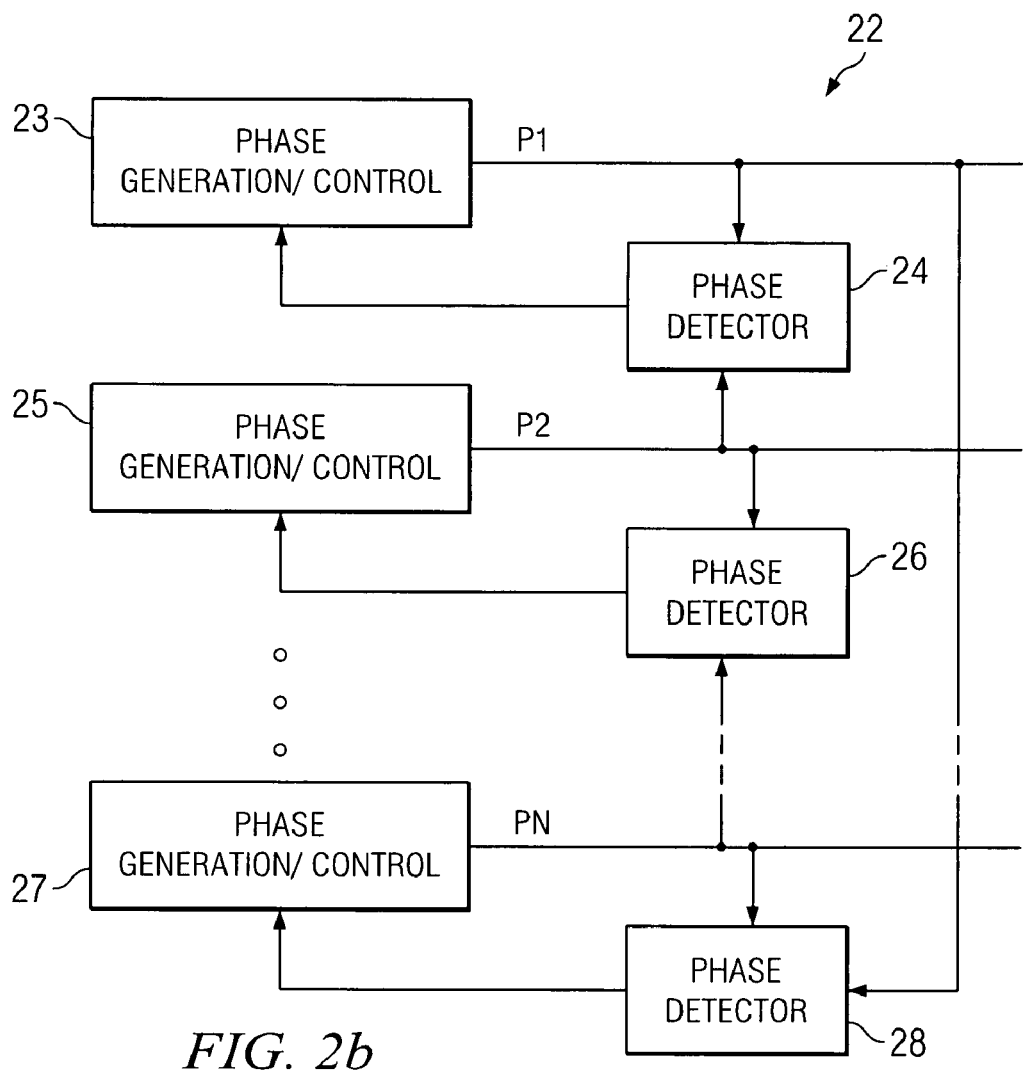

Referring now to FIG. 2*b*, a generalized interleaved multiphase oscillator 22 is illustrated. Oscillator 22 has a general number of phases N, denoted as phases P1-PN. Phase generation/control components 23, 25 and 27 generate periodic waveforms in each of phases P1, P2 and PN, respectively. Phases P1-PN can be combinations of signals for controlling signal switching components to generate periodic power waveforms or phases P1-PN can be the periodic power waveforms themselves. In the general case illustrated in FIG. 2*b*, there is a phase detector for each phase in oscillator 22. The feedback provided by phase detectors 24, 26 and 28 each depend upon two phases to obtain a relative phase measure. Accordingly, the phase information that is input into each phase detector 24, 26 and 28 is used to obtain a feedback signal to control the generation of a respective phase P1-PN to have a desired phase angle separation between the periodic waveforms of phases P1-PN. Accordingly, the control of the periodic waveform in each phase P1-PN depends upon a phase angle measurement from two different phases. When any of phase detectors 24, 26 or 28 detect a phase angle difference error, a correction to reduce the error propagates through components 23, 25 and 27 to adjust relative phase angle difference until the error is reduced for all phases. The propagation of the error through the phases synchronizes the periodic waveforms in each phase to have an overall desired phase angle separation between each phase. By synchronizing the period waveforms, the operating frequencies of phases P1-PN tend towards a single frequency, so that phases P1-PN operate at a given frequency. The given frequency tends to be an average of the different independent frequencies of phases P1-PN.

Phases P1-PN can be in any temporal order with respect to leading or lagging. That is, phases P1-PN can be arranged so that phase P2 lags P1 and phase PN lags P2. Alternately, phases P1-PN can be arranged so that phase P1 lags P2 or PN or both. The phase detectors 24, 26 and 28 are arranged to detect the desired relative phase difference in accordance with the temporal order in which phases P1-PN are arranged.

Figure 3:
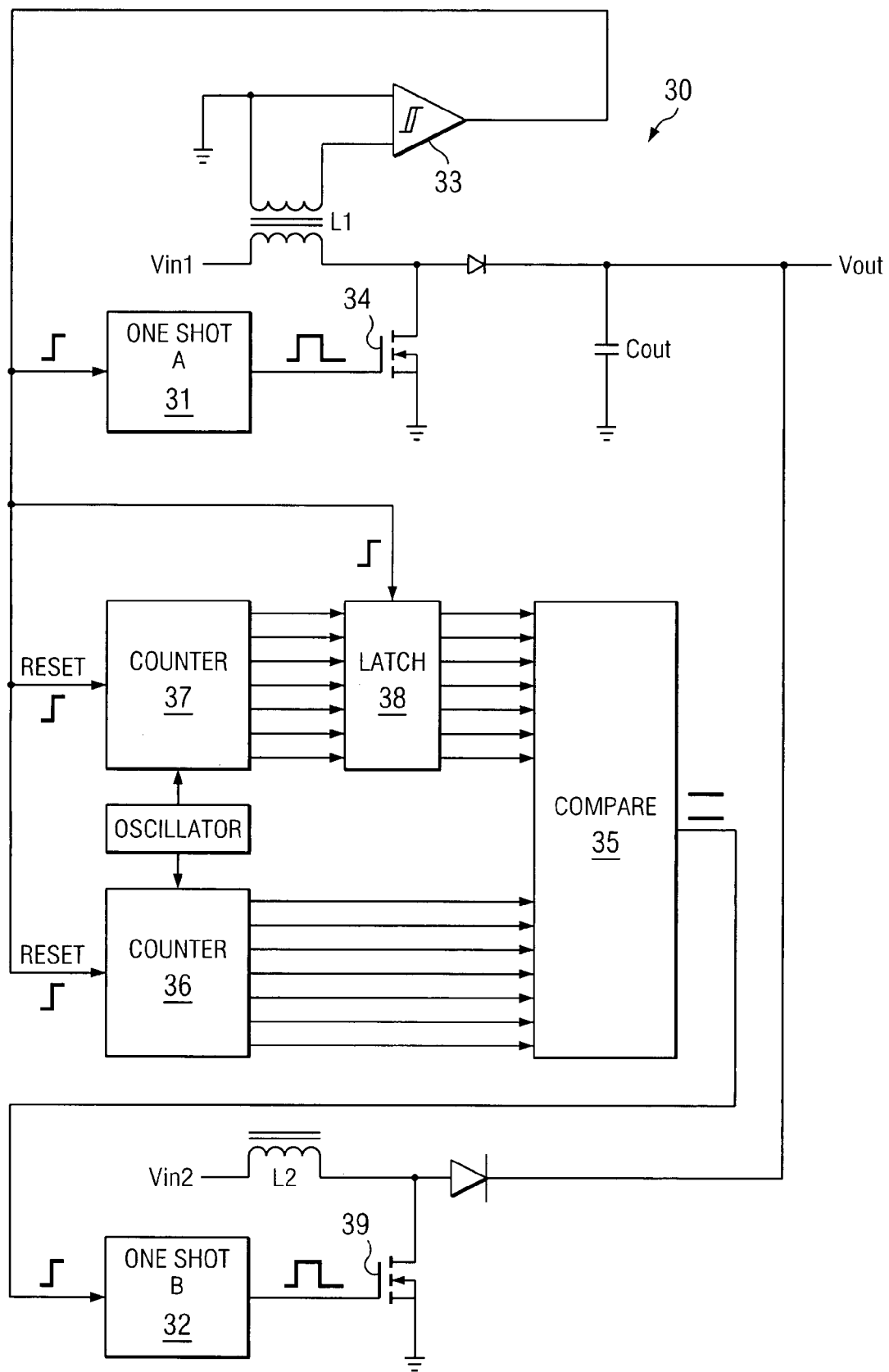
FIG. 3 is a circuit block diagram of an exemplary application of the present invention.

Referring to FIG. 3, another implementation of a variable frequency PWM control is illustrated as circuit 30. Circuit 30 operates as a boost-type power supply based on a PWM control with fixed on-time PWM signals Vin1 and Vin2 represent the two PWM phase input signals. The disclosed system and method for synchronizing a multiphase oscillator can be applied to any type of interleaved power supply, including buck, buck-boost, flyback and other power supply types. Circuit 30 provides a fixed on-time implementation of an interleaved boost power supply. One shot components 31, 32 are used to set an on time that determines the charge time of each inductor phase L1, L2 in each, respectively. One shots 31, 32 may be highly similar to each other in operational characteristics. An on-time start point occurs when a comparator 33 coupled to an inductor L1 senses zero current. At that point, one shot 31 provides a pulse to switch 34 to begin charging inductor L1. A counter 37 is provided to count the number of oscillator cycles from the firing of one shot 31 in a first phase until inductor current drops to zero in that phase. This information related to the phase cycle time is latched with latch 38 and compared to the value of another counter 36 that is activated at the same time as counter 37. When the counter 36 reaches one half of the count maintained in latch 38, one shot 32 is fired. PWM signals Vin1 and Vin2 are thereby maintained 180° out of phase with each other. However, PWM signals Vin1 and Vin2 can range from near 0% to near 100% for respective duty cycles.

In Circuit 30, the value in counter 37 can be divided in half by shifting the digital value one bit. This fast operation provides for a two-phase interleaved power supply where the phases are separated by 180°. In interleaved power supplies with more than two phases, the latched count, or accumulated value representing the period of a phase, is divided by the number of phases to determine when the next phase should start. An alternate embodiment measures peak average current to determine phase period. A faster clock can also be used instead of dividing the digital signal to reduce the time.

Referring to FIGS. 4a-4f, a number of graphs are shown that illustrate operation of the circuit of FIG. 3. In FIG. 4a, one shot 31 fires to produce a current in the first phase as shown in FIG. 4b. Upon reaching zero, the current through inductor L1 triggers the count for the start of the second phase. The count value for the second phase is half the accumulated count value for the first phase in the two-phase supply. FIG. 4c illustrates the change in voltage across the inputs of comparator 33, which is the voltage across inductor L1. Each zero crossing for current in inductor L1 causes a transition in the output of comparator 33. When the output of comparator 33 transitions from low to high, one shot 31 is restarted, latch 38 latches its input, and counters 36, 37 are reset. FIG. 4d illustrates counter 37 counting in a single cycle between resets provided by the output of comparator 33. Each cycle for counter 37 is roughly equivalent to the intervals between rising edges of output pulses provided by one shot 31. The representation of the value of counter 37 illustrated in FIG. 4d is shown as discrete counting steps, with six discrete count levels illustrated in this example. The output of counter 37 is a binary number, provided to an input of latch 38. Accordingly, latch 38 maintains the six-count level as a binary number, which is provided to a digital comparison device 35.

Referring to FIG. 4e, a single cycle count value for counter 36 is illustrated. In this example, counter 36 counts up to the same value as that of counter 37, or the value maintained in latch 38. However, counter 36 counts twice as fast as counter 37, so that when counter 36 reaches the value maintained in latch 38, the output of digital comparison device 35 triggers one shot 32. That is, counter 36 counts to the same value as that held in latch 38 to trigger one shot 32, but does so in half the time as does counter 37. Since counter 36 causes one shot 32 to be triggered approximately twice as often as one shot 31 is triggered, the start of the second phase occurs approximately half way through the first phase. One shot 32 is triggered once for every cycle of the first phase, since counter 36 is reset when there is a low to high transition output from comparator 33, indicating zero current in inductor L1. FIG. 4f illustrates one shot 32 initiating the beginning of the second phase when the output of digital comparison device 35 has a transition from low to high.

The configuration of circuit 30 may be modified to permit counters 36 and 37 to count at a same rate, and divide the output of counter 37 or latch 38 by 2 to obtain the same results of starting the second phase midway through the first phase, or maintaining 180° phase separation. If more than two phases are used, the output of counter 37 or latch 38 can be divided by the number of phases to indicate when the next phase should be started. Alternately, counter 36 can be arranged to count n times faster than counter 37, where n is the number of phases. It should be apparent that additional phases can begin counting, or accumulating a value representative of phase angle difference, based on the reset signal applied to counters 36, 37, or based on the output of digital comparison device 35. Additional ones of digital comparison device 35 may be used with additional phases, and the count or accumulation value of the additional counters or accumulators can be adjusted as appropriate.

The application of the multiphase oscillator of the present invention illustrated in FIGS. 3 and 4a-4f provides one shots 31 and 32 that have outputs of variable duration, such as may be dependent upon duty cycles of PWM inputs on Vin1 and Vin2. With such a configuration, inductors L1 and L2 are permitted to charge for variable lengths of time to variable maximum currents. In addition, because of the variable frequency nature of the interleaved PWM power supply, the cycle time for the first phase can vary, which is reflected in the count value for counter 37. That is, counter 37 counts until being reset with the beginning of each cycle of the first phase. Accordingly, the beginning of the second phase correspondingly varies with the length of the cycle reflected by the count in counter 37, so that the beginning of the second phase cycle is midway through the first phase cycle.

Figure 5:
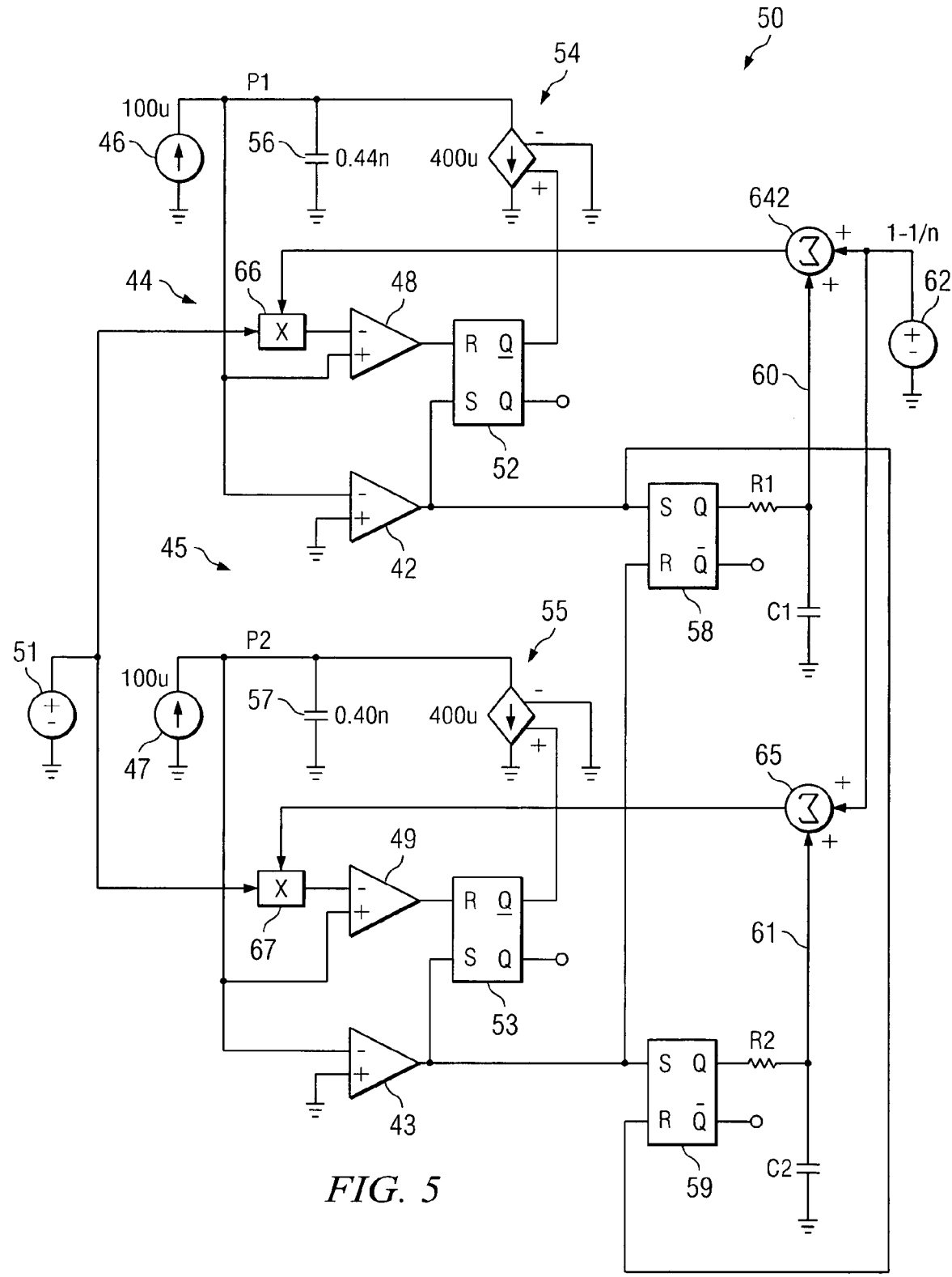
FIG. 5 is a circuit block diagram illustrating a two-phase oscillator with two phase detectors.

Referring now to FIG. 5, another embodiment of the present invention is illustrated as a circuit 50. Circuit 50 includes two oscillators 44,45 composed of current sources 46,47, comparators 48,49, RS flip-flops 52,53, switched current sources 54,55 and timing capacitors 56,57, respectively. Oscillators 44 and 45 produce triangular periodic voltage waveforms across timing capacitors 56,57, by being charged by current sources 46,47 and discharged by switched current sources 54,55, respectively. The outputs of comparators 48,49 and flip-flops 52,53 are rectangular waveforms with a phase angle difference of 180° between oscillators 44,45. The triangular waveforms across capacitors 56,57 and the rectangular waveforms output from comparators 48,49 and flip-flops 52,53 have a frequency that is proportional to the value of voltage source 51, which is applied to the inverting inputs of comparators 48,49.

Capacitors 56,57 are illustrated as having different values of capacitance, to indicate that oscillators 44 and 45 operate independently at different frequencies. In accordance with the present invention, the different independent frequencies of oscillators 44,45 are synchronized with a phase difference of 180°.

Flip-flops 58, 59 act as phase detectors to detect a phase angle difference between phases P1 and P2. Flip-flop 58 measures a phase angle difference from phase P1 to phase P2, while flip-flop 59 measures a phase angle difference from phase P2 to phase P1. The relative phase angle difference measurements between phases P1 and P2 are based on a pulse received from comparators 42 and 43. A pulse received on the S input of flip-flop 58 produces a logic high level on the normal output of flip-flop 58, which is applied to a low pass filter composed of resistor R1 and capacitor C1. Similarly, a pulse on the output of comparator 43 provided to the S input of flip-flop 59 produces a logic high level on the normal output of flip-flop 59 that is applied to the low pass filter composed of resistor R2 and capacitor C2. The pulse output from comparator 42 marks the beginning of a cycle in phase P1. The pulse output from comparator 42 also resets flip-flop 59 to produce a logic low level at the normal output of flip-flop 59. The reset of flip-flop 59 marks a midpoint of phase P2. Similarly, the pulse output of comparator 43 starts a new cycle of phase P2, and resets flip-flop 58 to produce a logic low level at the normal output of flip-flop 58. Flip-flop 58 being reset marks a midpoint of phase P1. During steady state operation of circuit 50, the average value of the output of flip-flops 58,59 acting as phase detectors will vary from a logic low level to a logic high level as the phase difference between phases P1 and P2 varies from zero to 360°.

Output voltages 60,61 from the low pass filters composed of R1, C1 and R2, C2, respectively, are summed with an offset voltage 62 at summing junction 64,65, respectively. Offset voltage 62 is equal to 0.5 volts in this exemplary embodiment having two phases. In general, offset voltage 62 is set to 1-1/n, where n is the number of phases. The resulting sum provided by summing junction 64,65 is applied to multipliers 66,67, which influence the value of voltage source 51 applied to comparators 48,49, respectively. When the outputs of comparators 48,49 or the outputs of flip-flops 52,53 have frequencies that are equal with a phase difference of 180°, the value applied from summing junctions 64,65 is unity and the period of the waveforms and oscillation frequencies remain unchanged.

When oscillators 44,45 vary in phase difference from 180°, the output of summing junctions 64,65 varies, so that one summing junction output is greater than unity, and the other summing junction output is less than unity. The change in the output value of summing junctions 64,65 cause the frequency of one oscillator to decrease and the frequency of the other oscillator to increase until the phase difference between phases P1 and P2 is driven to approximately 180°.

For example, if flip-flop 58 detects a phase difference between phase P1 and P2 that is greater than 180, a greater value for voltage 60 is applied to summing junction 64, increasing the multiplying factor applied to multiplier 66 to greater than unity. The voltage value applied to the inverting input of comparator 48 is thus increased, creating a higher threshold for switching the output of comparator 48. The higher threshold for comparator 48 causes the charging cycle of capacitor 56 to be extended, since flip-flop 52 maintains a high logic level output for a longer period of time. The extended charging cycle increases the period of the periodic waveform in phase P1, which tends to retard the phase angle of phase P1, effectively decreasing the frequency of oscillator 44.

Similarly, flip-flop 59 is reset after a shorter interval than usual, causing voltage value 61 to be less than usual, so that the value produced by summing junction 65 is less than unity. Because the multiplying factor applied to multiplier 67 is less than unity, the threshold on the inverting input of comparator 49 tends to be decreased, which shortens the interval over which capacitor 57 charges, since flip-flop 52 changes state from a high logic level to a low logic level sooner. The shortened charging cycle for capacitor 57 tends to decease the period of the periodic waveform in phase P2, which tends to advance the phase angle of phase P2, effectively increasing the frequency of oscillator 45.

If voltage source 51 changes value during operation of circuit 50, the frequencies of oscillators 44 and 45 both change to be proportional to the value of voltage source 51. When oscillators 44,45 change frequency, there may be a small frequency difference between oscillator 44 and 45, due to component tolerances, for example. The small frequency difference between oscillators 44 and 45 is quickly overcome within several cycles so that phases P1 and P2 are again synchronized with a phase angle difference of 180°.

Figure 6:
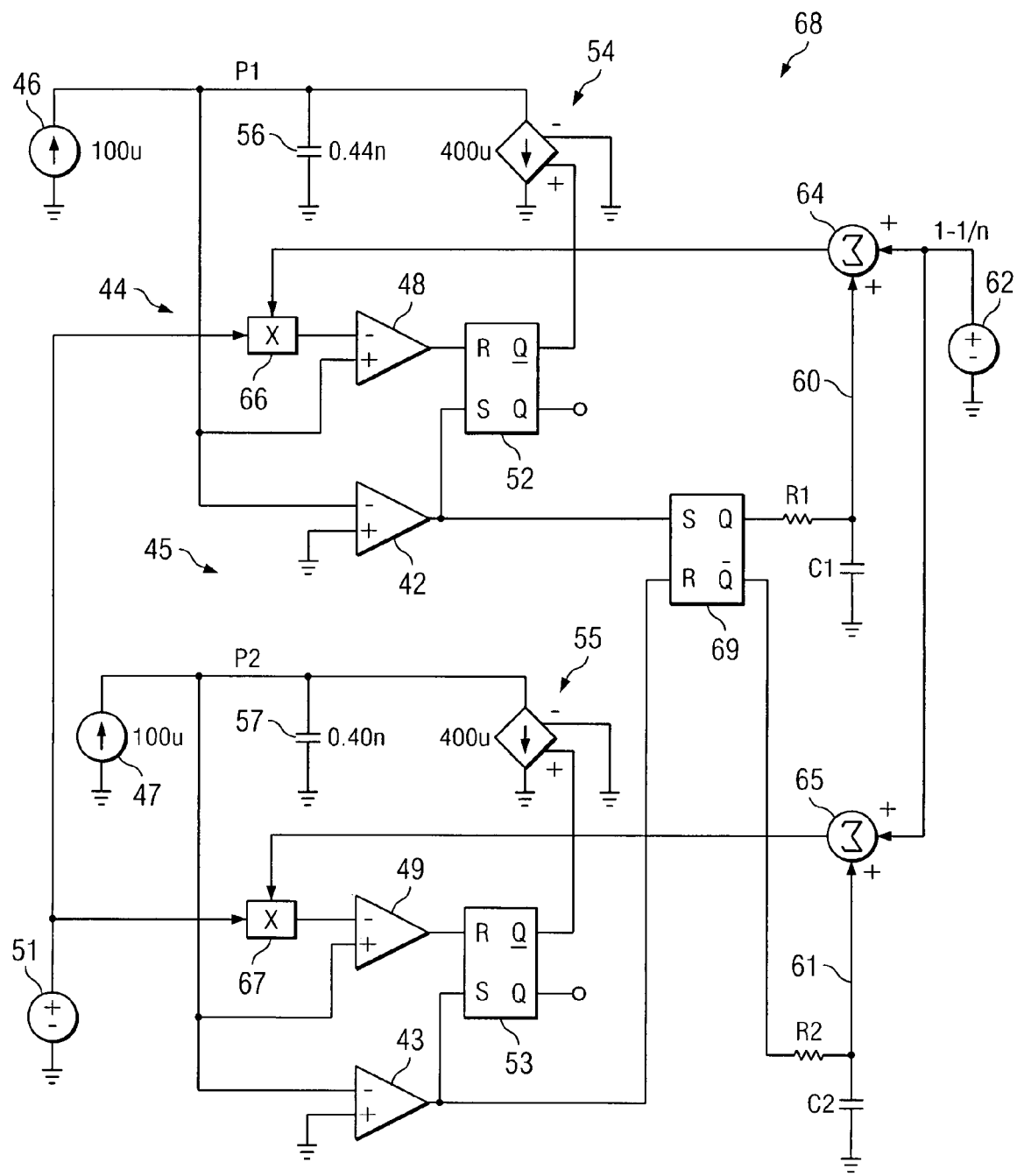
FIG. 6 is a circuit block diagram illustrating a two-phase oscillator with one phase detector.

Referring now to FIG. 6, another embodiment of the present invention is illustrated as a circuit 68. Circuit 68 is substantially similar in structure and operation to that of circuit 50 illustrated in FIG. 5. Circuit 68 represents a special case of two oscillators in which the two phase detector signals are complimentary, so that a single flip-flop 69 may be used as a phase detector. Accordingly, the special case for two oscillators illustrated in circuit 68 has a single phase detector for two phases, in contrast to the general configuration according to the present invention, where there are the same number of phase detectors as there are phases.

Figure 7:
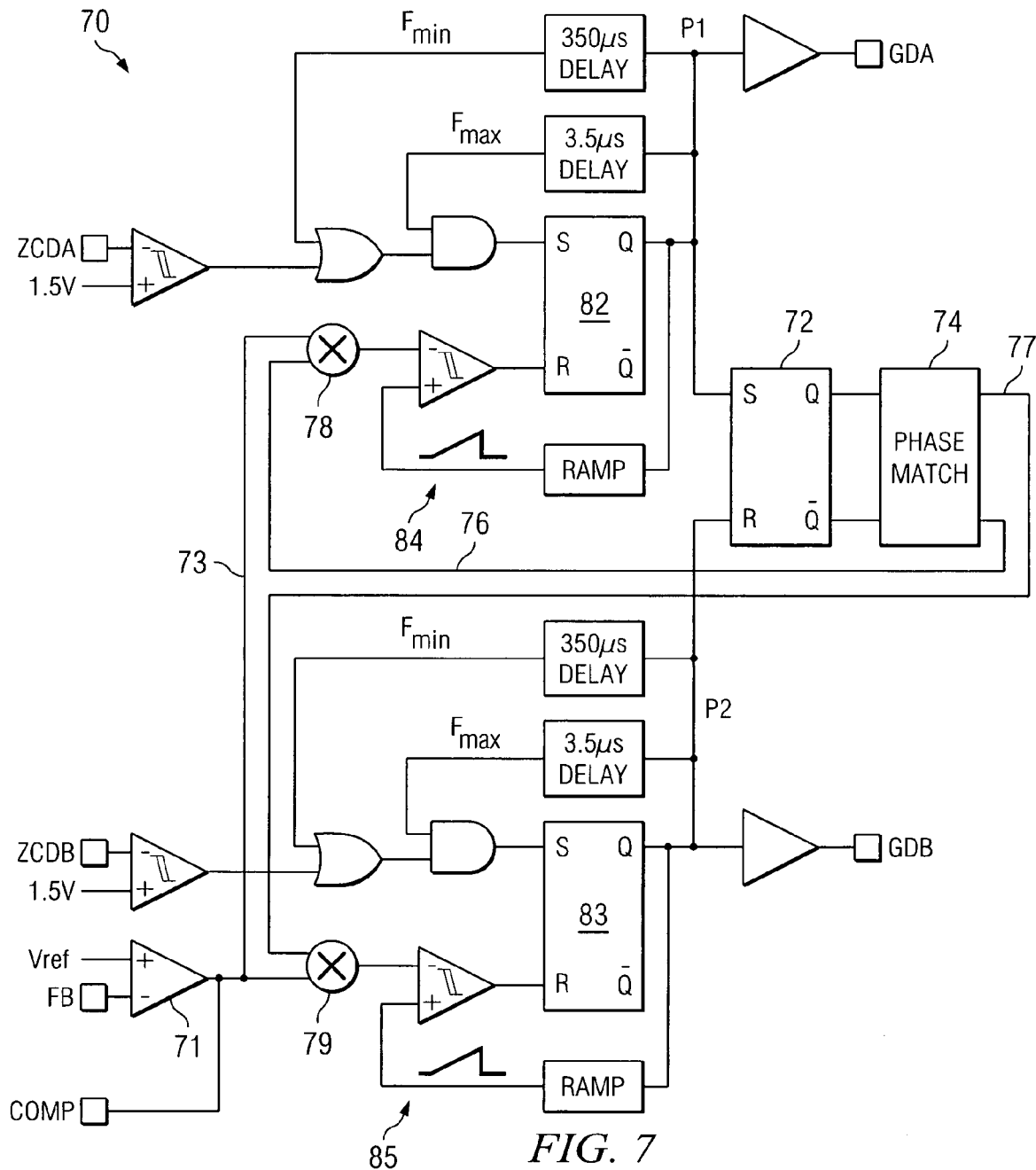
FIG. 7 is a circuit block diagram of a two-phase oscillator applied to a variable frequency interleaved switching power supply.

Referring now to FIG. 7, another exemplary embodiment of a control circuit 70 according to the present disclosure is illustrated. In this embodiment, a synchronized multiphase oscillator is used to control signals used to drive power switches of two separate phases P1 and P2. The switching signals that make up phases P1 and P2 are applied to an edge triggered flip-flop 72. The outputs of edge triggered flip-flop 72 are applied to a control loop filter 74. Control loop filter 74 provides a phase matching function to provide error signals 76,77 that adjust the separation of phases P1,P2 to track with each other and maintain a desired phase separation. In the two phase example in FIG. 7, the periodic waveforms in phases P1,P2 are maintained to have a 180° phase angle difference.

The periodic waveforms in phases P1 and P2 are PWM signals that drive power switches used to provide periodic power signals that are interleaved in accordance with the present invention. Control circuit 70 provides power switch gate drives through points GDA and GDB based on phases P1 and P2, respectively. The periodic signals in phases P1 and P2 are digital or logic signals applied to edge-triggered flip-flop 72, so that flip-flop 72 receives phase difference information depending upon how the set and reset inputs of flip-flop 72 are activated. The outputs of flip-flop 72 maintain the respective S and R edge-triggered states until reset or set, respectively, by edge-triggered inputs on an alternate input of flip-flop 72. Accordingly, the outputs of flip-flop 72 are complimentary signals with a 50% duty cycle. An operational phase angle difference different from that desired is detected if one or both of the outputs of flip-flop 72 drift away from the complimentary, 50% duty cycle relationship. That is, if the outputs of flip-flop 72 do not maintain a 180° phase angle separation, the error is detected and fed back to the appropriate phase control to appropriately advance or retard the respective phase angle. Control loop filter 74 provides logic and signaling to generate an appropriate error signal 76,77, for each phase. Error signals 76,77 are applied to multipliers 78,79, respectively, to amplify error signals 76,77 on the basis of a feedback error voltage FB in conjunction with an operating reference voltage Vref applied to amplifier 71. The output of amplifier 71, as optionally compensated through input COMP, provides a closed loop reference control signal 73 that regulates the frequency of oscillators 84,85. That is, the frequency of oscillators 84,85 is proportional to the input voltage provided by amplifier 71 as control signal 73.

Control signal 73 provides a threshold for causing a reset of flip-flops 82,83 which causes respective phases P1,P2 to go to a logic low level. The threshold is provided as a ramp that causes a reset in phases P1 or P2 when the output of multipliers 78,79 exceed the associated ramp value for their respective phases. The ramp signals for each respective phase restart each time an associated phase P1 or P2 rises to a logic high level. Each of the PWM waveforms in phases P1,P2 are turned off, or set to a logic low level, when the associated ramp reaches a threshold level set by the output of amplifier 71 multiplied by error signals 76 or 77 modifies control signal 73 through multipliers 78,79 to reach a threshold established by the ramp in each phase. When the output of multipliers 78,79 reach the ramp threshold, flip-flops 82,83 are respectively reset at a desired time to obtain an adjustment for a phase angle difference between phases P1 and P2. For example, if the phase angle difference between phases P1 and P2 is greater than 180°, error signal 76 has a decreased value to decrease the output of multiplier 78 to extend the amount of time needed to meet the threshold established by the ramp in phase P1. Accordingly, a reset of flip-flop 82 controlling phase P1 is slightly delayed, permitting the period of a pulse output from flip-flop 82 in phase P1 to be extended, thereby decreasing the phase angle difference between phases P1 and P2 toward 180°. Error signal 76 is similarly increased to retard phase P1 if the phase angle difference between phases P1 and P2 is less than 180°. Error signal 77 operates similarly with respect to phase P2 to advance or retard phase P2 by lengthening or shortening the period of the pulse output from flip-flop 83 in phase P2.

Oscillators 84,85 also include delays to establish a minimum and maximum frequency for each of phases P1 and P2. For example, a minimum frequency is established by asserting an input into flip-flops 82,83 after a 350 microsecond delay, thereby avoiding an oscillator cycle from becoming too long. A maximum frequency for oscillators 84,85 is established with a 3.5 microsecond delay to enable the set inputs of flip-flops 82,83. The 3.5 microsecond prevents a new cycle start until 3.5 microseconds has elapsed to thereby prevent the oscillator cycles from becoming too small.

Figure 8A:
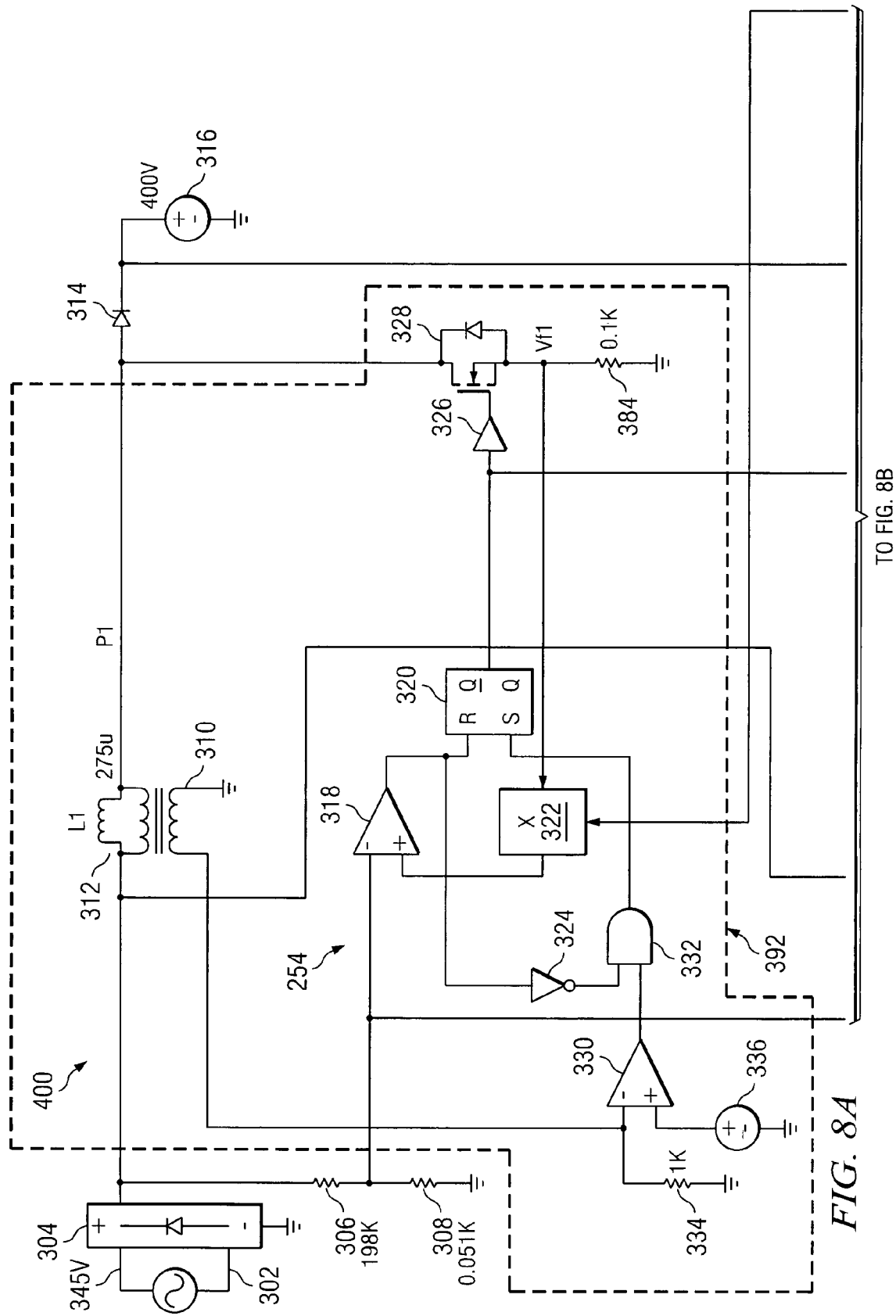
FIG. 8 is a circuit block diagram of a two-phase oscillator applied to another variable frequency interleaved switching power supply.
Figure 8B:
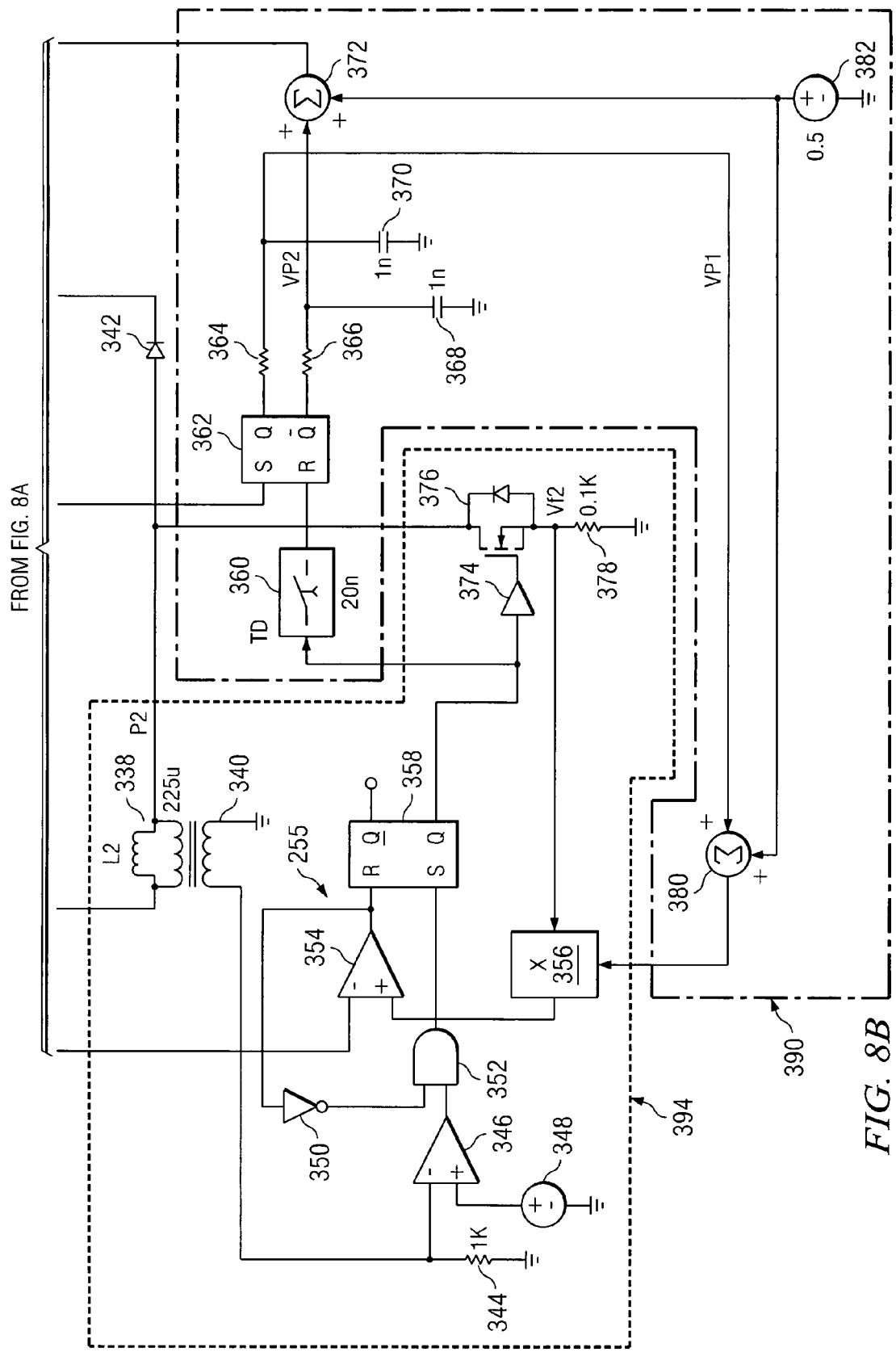

FIG. 8 shows a two-phase, variable frequency interleaved power converter 400 constructed with two synchronized oscillators, 254, 255. Power converter 400 includes AC voltage source 302, rectifier module 304, resistors 306 and 308, diodes 314 and 342, DC voltage output 316 and a block 392 representing phase P1 and a block 394 representing phase P2 and a phase detector 390 for feedback and phase control.

Block 392 includes inductor 312 (L1), voltage transformer 310, comparator 318, inverter 324, multiplier 322, AND gate 332, comparator 330, resistors 334 and 384, reference voltage source 336, SR latch 320, on-off switch controller 326, and FET (n-channel)-based switch 328. Voltage Vf1 is generated at the junction of resistor 384 and switch 328.

Block 394 includes inductor 338 (L2), voltage transformer 340, comparator 354, inverter 350, multiplier 356, AND gate 352, comparator 346, resistors 344 and 378, reference voltage source 348, SR latch 358, on-off switch controller 374, and FET (n-channel)-based switch 376. Voltage Vf2 is generated at the junction of resistor 378 and switch 376.

Phase detector 390 includes a time delay 360 (illustratively shown as 20 nanoseconds), SR latch 362, resistors 364 and 366, capacitors 368 and 370, summers 372 and 380, and constant voltage source 382. Time delay 360 avoids simultaneous highs at the S and R inputs of the SR latch 362.

The two different phases operate by charging and discharging inductors L1 and L2, respectively. The charging part of each cycle for each phase begins when the respective inductor current reaches zero. Voltage transformer 310 provides a sign change indication when the current in inductor L1 reaches zero. The sign change indication is input into comparator 330. A reference voltage 336 is also input into comparator 330, and has a value that corresponds to a practical realization indicating the point at which current through inductor L1 is zero. Reference voltage 336 can be zero, or ground potential. Similarly, voltage transformer 340 provides a voltage indicative of the sign of the current flowing through inductor L2, which voltage is input into comparator 346. Reference voltage 348 provides a value that corresponds to a practical realization value that indicates zero current through inductor L2. Reference voltage 348 can be zero, or ground potential. Reference voltages 336,348 may be set to a value to compensate for non-ideal components, for example, and may be dynamic.

As comparators 330 and 346 change state in each respective phase when the current through the corresponding inductor is zero, a new cycle begins in the corresponding phase. Each of phases P1 and P2 operate as fixed on-time power converters, so that power converter 400 inherently exhibits a PFC value close to unity. Because each phase begins charging its respective inductor when the inductor current is zero, the power converter 400 operates in transition mode, where each phase is permitted to reach zero current before beginning a new cycle. It should be apparent that power converter 400 may be operated in continuous or discontinuous mode(s) in accord with the present invention. Operation in transition mode offers the possibility of reducing switching losses through zero voltage or zero current switching.

The power converter 400 provides output power based on a desired reference set point, illustrated in FIG. 8 as a node voltage between resistors 306 and 308. The feedback used to control switching, and thus charging and discharging of inductors L1 and L2, is drawn from the voltage across resistors 384 and 378 for phases P1 and P2, respectively. The voltages on resistors 384 and 378 reflect the amount of current flowing through switches 328 and 376, respectively, when the switches are conducting. Switches 328,376 are driven by drivers 326,374. Feedback voltages Vf1 and Vf2 contribute to determining when switches 328 and 376 are switched off, or placed in a high impedance state.

To synchronize phases P1 and P2 to obtain a desired phase angle difference, the point at which switches 328 and 376 are turned off is modified for each phase P1 and P2. The modified turn off point depends on the phase difference between phases P1 and P2, as provided by a relative measure. Phase detector 390 provides the relative measure of phase difference between phases P1 and P2. Phase detector 390 also produces control outputs to influence feedback signals Vf1 and Vf2 in each of phases P1 and P2. The value of the control outputs provided by phase detector 390 for each phase depends upon a timing indication obtained from the other phase. Accordingly, each of phases P1 and P2 is adjusted by advancing or retarding the discharge portion of the cycle, or proportioning the charge and discharge portions, to maintain a phase difference of 180°.

Phase detector 390 includes SR latch 362, the S and R inputs of which are tied to the switch control signals for switches 328 and 376, respectively. When switch 328 is turned on, the S input to latch 362 is active on the rising edge of the signal, and when switch 376 is turned on, the R input to latch 362 is active on the rising edge. The output state of latch 362 changes with the rising edges of the S and R inputs.

The normal, or non-inverted, output of latch 362 controls charging and discharging of capacitor 370, so that when the normal output state is high, capacitor 370 charges through resistor 364, and when the normal output state is low, capacitor 370 discharges. The same operation occurs for the inverted output of latch 362 with respect to capacitor 368. Voltages Vp1 and Vp2 represent the charges placed on capacitors 370 and 368, respectively, during the cycles of each of the different phases P1 and P2. Voltages Vp1 and Vp2 have a periodic cycle that reflects the phase angle difference between phase P1 and P2. Constant voltage 382 is illustratively set at 0.5V using the relation $(n-1)/n$. That is, for the case of two phases, $N=2$ thereby making the constant voltage $382=(2-1)/$ 2=½=0.5V. Voltage Vp1 is summed with constant voltage 382 at summing junction 380 to produce a multiplier contribution to feedback voltage Vf2. Voltage Vp2 is added to constant voltage 382 at summing junction 372 to provide a variable multiplication contribution to feedback voltage Vf1. Accordingly, the point at which inductors L1 and L2 begin discharging, based on feedback voltages Vf1 and Vf2, can be changed by varying the multiplier value supplied by phase detector 390. By shifting the point at which a discharge of inductors L1 and L2 commences, the cycle period of the respective phases changes, thereby changing the relative phase difference between phases P1 and P2.

Operation of phase detector 390 is similar to dual accumulators that add variable values to multiplier values output from summing junctions 372 and 380. The outputs of summing junctions 372 and 380 influence feedback voltages Vf1 and Vf2, respectively, to adjust a time at which a discharge portion of a respective phase cycle begins. With respect to phase P1, the charging of capacitor 368, when the inverted output of latch 362 is high, increases the multiplier value applied to feedback voltage Vf1 by an amount that is related to the phase difference between phases P1 and P2. The inverted output of latch 362 becomes high when a cycle of phase P2 begins, i.e., on the rising edge of the R input, and low when a cycle of phase P1 begins, i.e., on the rising edge of the S input. Accordingly, the output of latch 362 provides a measure of relative phase difference between phases P1 and P2.

For example, if phase P1 is advanced beyond the 180° phase angle difference desired between phases P1 and P2, the rising edge of the set input does not occur until a later time. Accordingly, the inverted output of latch 362 is high for a longer period of time, which places a larger charge value on capacitor 368. Since the additive value provided to summing junction 372 is increased by the larger charge value, multiplier 322 produces an increased slope output in combination with feedback voltage Vf1. Since the slope of the output of multiplier 322 is increased, the conditions for commencing a discharge part of a cycle, as seen on the R input of latch 320 to turn off switch 328, are met earlier than that of the previous cycle for phase P1. As the R input to latch 320 becomes active earlier, switch 328 is turned off earlier, or placed in a high impedance state earlier, thereby providing an earlier start point for discharging inductor L1. The earlier commencement of the discharge portion of the cycle of phase P1 tends to shorten the cycle period and retard the phase, thereby bringing the phase difference closer to the desired value of 180°.

In the above example, the slope of the output of multiplier 322 is changed by the increased value supplied by summing junction 372 over a portion or all of a charging part of the cycle for phase P1. Accordingly, the output of multiplier 322 can have multiple slopes, so that it reaches a value for reference voltage Vref at differing times depending upon how the period of the cycle for phase P1 should be varied, thereby varying the phase difference between phases P1 and P2. The control variable used to modify the slope of the output of summing junction 372 is the value added to summing junction 372 by capacitor 368. This value is dependent upon the timing at which the reset input R to latch 362 receives a rising edge signal from the normal output of latch 358. Capacitor 368 begins to discharge at the beginning of a cycle of phase P1, since the output of latch 320 is a high value at that point, providing a rising edge signal to input S of latch 362, which places the inverted output of latch 362 into a low state. The contribution of charging and discharging capacitor 368 to summing junction 372 is the control variable that influences the slope of the output of multiplier 322, based on the value of feedback voltage Vf1. The change to the slope of the output of multiplier 322 operates to advance or retard the point at which the state of latch 320 is switched to begin a discharge portion of the cycle of phase P1. Alternately, or in addition, the variable slope of the output of multiplier 322 changes the peak of the waveform produced in phase P1, which consequently changes the period of the cycle of phase P1. Viewed another way, the charge and discharge portions of the cycle of phase P1 are proportioned to vary the cycle period and thus the phase angle difference between phases P1 and P2.

Phase P2 is similarly controlled based on the variable additive value provided by capacitor 370 to summing junction 380. The charge placed on capacitor 370 depends upon the state of the normal or non-inverted output of latch 362. Based on a rising edge signal applied to the R input of latch 362, capacitor 370 begins discharging as the charge portion of the cycle of phase P2 begins. The influence of the varying added value Vp1 supplied to multiplier 356 is related to the phase angle difference between phases P1 and P2. As with the control for phase P1, the output of multiplier 356 applied to the non-inverting input of comparator 354 has a modified slope with a value dependent upon the value of voltage Vp1. The modified slope of the output of multiplier 356 helps to indicate when the discharge portion of the cycle for phase P2 should begin. The value applied to the non-inverting input of comparator 354 determines the point in the period of the cycle of phase P2 when discharging of inductor L2 begins, by providing a high value to the R input of latch 358, thereby turning off switch 376.

A desired phase angle difference between phases P1 and P2 can be achieved by obtaining a particular duty cycle for the normal and inverted outputs of SR latch 362. For example, with two phases to be separated by a phase angle of 180°, the normal and inverted outputs are complementary with a 50% duty cycle. Another way to view the desired relationship of the normal and inverted outputs of SR latch 362 is that they are complements with a 180° phase difference. That is, the rising edges of inputs S and R are separated by a phase angle of 180° when the waveforms in phases P1 and P2 have a desired phase angle relationship. As another example, the phase detector for a three-phase system has a duty cycle of 33% where the phases are separated by 120°. In the three phase exemplary embodiment where the phase detector is configured as an SR flip flop, the rising edges of the S and R inputs to the SR flip flop are separated by 120° when the waveforms in the three phases have a desired phase angle relationship. These illustrative examples can be extended to the general case, where the duty cycle of a given phase detector 1/n%, where n is the number of phases. Similarly, when the phase detectors are implemented as SR flip flops, the rising edges of the S and R inputs to the SR flip flop are separated by 360°/n, where n is the number of phases, when the waveforms in the phases have a desired phase angle relationship.

With the variable period times of the waveforms in phases P1 and P2 adjusted to obtain a desired relative phase difference, phases P1 and P2 are synchronized. The result of summing phases P1 and P2, as occurs at the cathodes of diodes 314 and 342, is substantially similar to that illustrated in FIG. 1d. Thus, power converter 400 provides low output current ripple, reduced peak input current, and increased output ripple frequency, making the output ripple easier to filter. As the phase difference between phases P1 and P2 is continually adjusted, the frequency of the waveforms in phases P1 and P2 tends to be adjusted toward an average frequency, derived from an initial, potentially differing frequency in each of phases P1 and P2. For example, while the values for inductors L1 and L2 are preferably a match, in practice it is difficult to obtain close tolerances on these components without a prohibitively high cost. Consequently, oscillators 254, 255 operate at differing frequencies when free running due to the different values. With the synchronization provided by the concept according to the present invention, oscillators 254, 255 can be synchronized to a common, average frequency.

Figure 9:
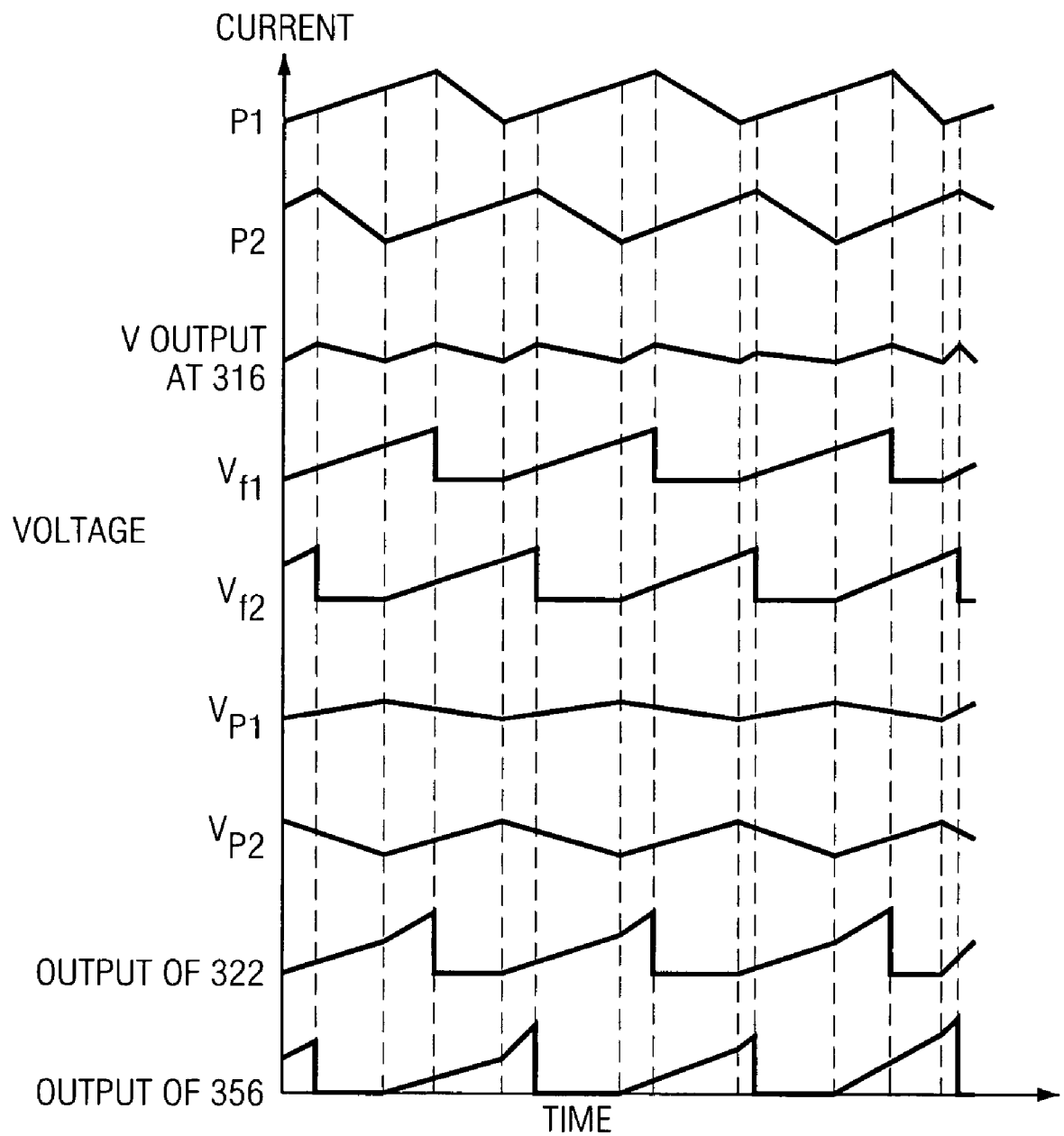
FIG. 9 is a timing diagram illustrating operation of the circuit of FIG. 8.

FIG. 9 shows an exemplary timing diagram for signals produced in power converter 400. The horizontal axis shows time. The vertical axis shows current waveforms for phases P1, P2, output voltage Vout, feedback voltages, Vf1, Vf2, voltages Vp1, Vp2, and outputs at multipliers 322 and 356. A person having ordinary skill in the art would appreciate that a similar timing diagram can be drawn for a synchronized multiphase oscillator having three or more phases. The outputs of multipliers 322,356 illustrate a dual slope waveform that shows the influence of the multiplication of feedback voltages Vf1, Vf2 with summation voltages derived from voltages Vp2, Vp1. In this sense, feedback voltages Vf1, Vf2 can be viewed as ramp values used to determine a threshold for the reset inputs of flip-flops 320,358, similar to control circuit 70 illustrated in FIG. 7.

Figure 10:
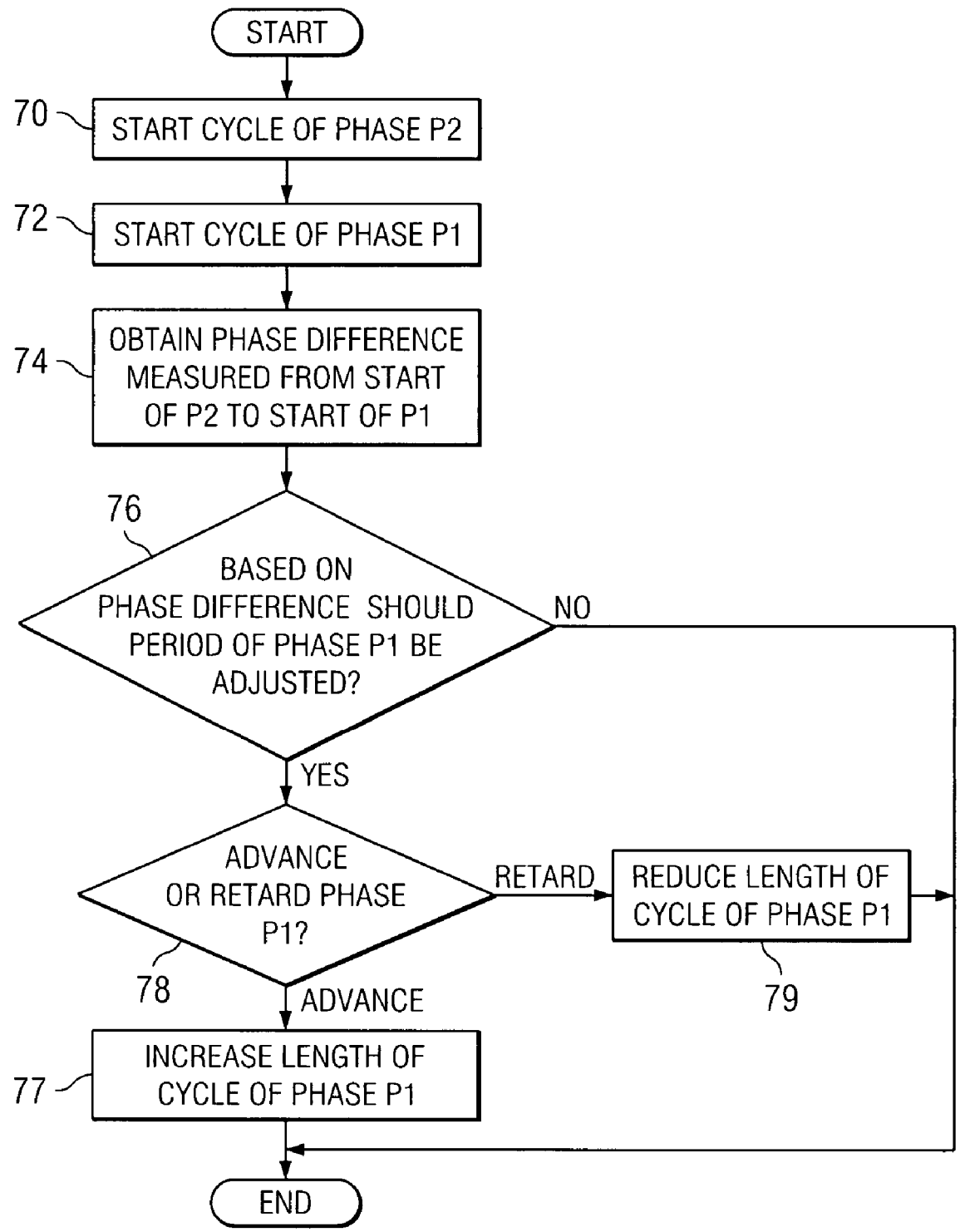
FIG. 10 is a flow diagram illustrating operation of a synchronized two-phase oscillator in accordance with the present invention.

FIG. 10 shows an exemplary flowchart describing the steps and decisions for advancing or retarding the phase angle of phase P1. A block 70 shows the start of a cycle of phase P2. A block 72 shows the start of a cycle of phase P1. This exemplary sequence presumes phase P2 lags phase P1. Phase difference information is obtained by measuring a time interval between a start of a cycle of phase P2 and a start of a cycle of phase P1 as shown in a block 74. A decision block 76 indicates if a phase adjustment is done if the measured phase difference between phase P1 and phase P2 is different from the desired phase difference. In the case where a phase adjustment is desirable, as indicated in the YES branch of decision block 76, process flow is directed to a decision block 78. Decision block 78 determines whether the cycle of phase P1 should be advanced or retarded. If the phase angle of phase P1 should advance, the length of the cycle of phase P1 is increased, as indicated in a block 77. Similarly, if the phase angle of phase P1 should be retarded, the length of the cycle of phase P1 is reduced, as indicated in block 79. A person having an ordinary skill in the art would appreciate that similar steps and decisions can be taken for adjusting the cycle of phase P2 based on measurements of phase difference taken with respect to phase P1.

Figure 11:
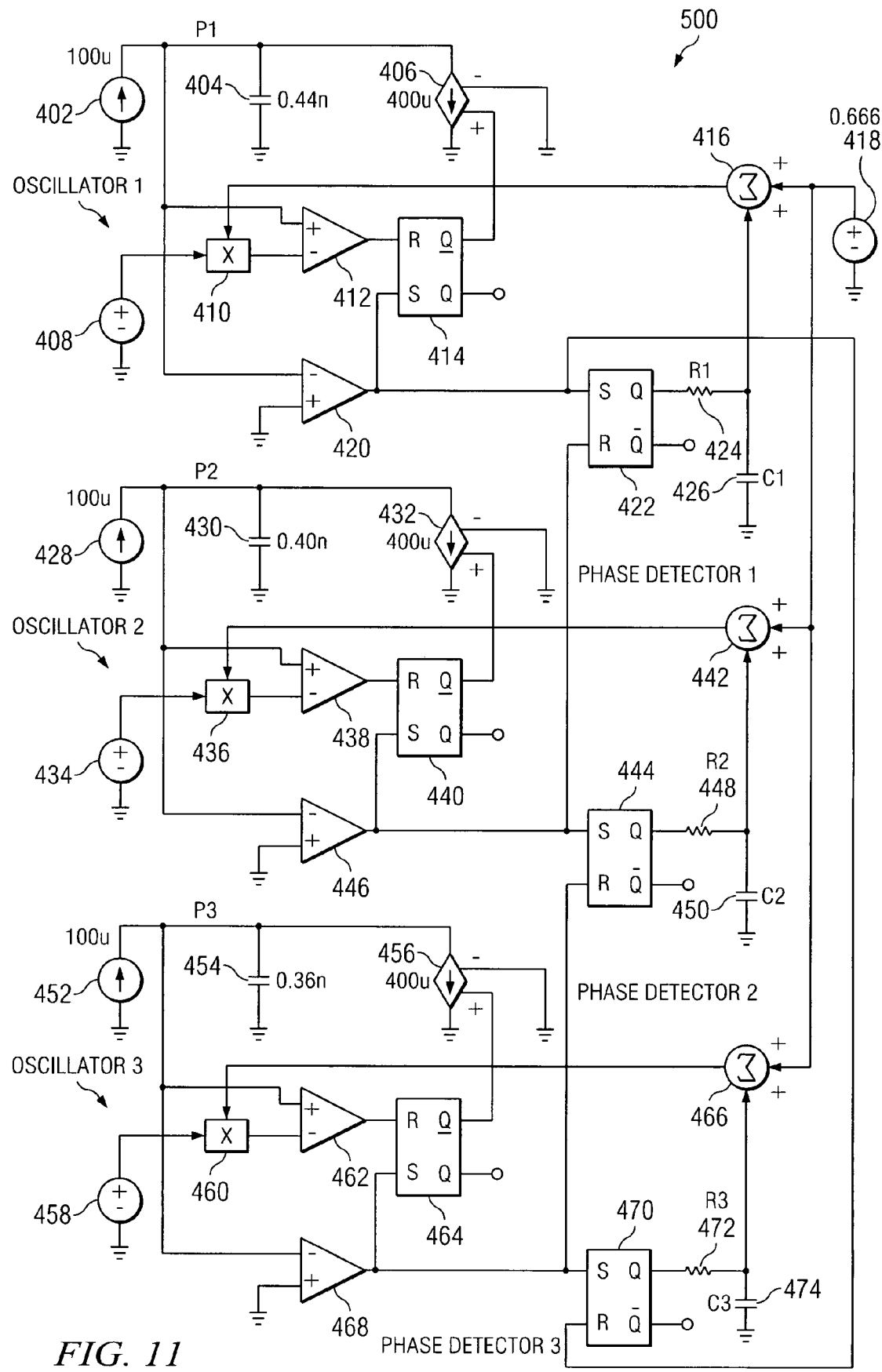
FIG. 11 is a circuit block diagram illustrating a synchronized three-phase oscillator.

Referring to FIG. 11, a 3-phase embodiment of the present invention is illustrated generally as multiphase oscillator 500. Multiphase oscillator 500 has three phases represented by variable frequency oscillators 1, 2 and 3. The waveforms in phases P1, P2 and P3 have a desired phase angle separation of 120° from the waveforms of the other phases when the phases are synchronized.

Each of phases P1, P2 and P3 is controlled to have a desired phase angle difference with respect to each other with a similar control configuration to that illustrated and described with respect to power converter 400 in FIG. 8. Phase P1 of converter 500 includes a multiplier 410 with a voltage input 408 that is multiplied with a value that depends upon the contribution to summing junction 416 by capacitor C1. Capacitor C1 charges when the normal output of latch 422 is high, and discharges when the normal output is low. The normal output of latch 422 transitions to a high state upon a rising edge of a pulse being delivered to the S input of latch 422. The pulse input, provided by comparator 420, marks a beginning of a cycle for phase P1. The output of comparator 420 is a pulse due to the feedback from capacitor 404 being applied to the inverting input of comparator 420, the non-inverting input being tied to ground, or zero potential. Accordingly, when capacitor 404 discharges to just below zero, comparator 420 changes state to provide a high level output to the S input of latch 414, thereby turning off switched current supply 406, and permitting capacitor 404 to charge with current source 402. As capacitor 404 charges, the voltage applied to the inverting input of comparator 420 rises above zero, causing the output of comparator 420 to transition to a low state, thereby establishing a pulse marking the beginning of the cycle for phase P1.

The pulse applied to the S input of latch 422 causes the normal output to transition to a high state, thereby charging capacitor C1. Capacitor C1 continues to charge until a rising edge of a pulse provided by comparator 446 is applied to the R input of latch 422 to reset the normal output to a low state, thereby permitting capacitor C1 to discharge. The separation of the rising edges of the pulses output from comparators 420 and 446 represents the phase difference between phases P1 and P2. Accordingly, the charge placed on capacitor C1 similarly represents the phase difference between phases P1 and P2.

If the phase difference, i.e., an operating phase difference, between phases P1 and P2 increases, a greater charge is placed on capacitor C1 than when phases P1 and P2 have a desired phase separation. The larger charge placed on capacitor C1 contributes to increasing the value supplied by summing junction 416 to multiplier 410, so that the output of multiplier 410 has a ramped output. The ramped output applied to the inverting input of comparator 412 produces a longer time interval before comparator 412 produces a pulse output to the R input of latch 414 to change the state of the inverted output of latch 414 to begin the discharge portion of the cycle of phase P1. By extending the charging portion of the cycle of phase P1, the period of the cycle for phase P1 is increased, thereby reducing the phase difference between phases P1 and P2.

Similarly, if the phase difference between phases P1 and P2, i.e., an operating phase difference, is smaller than the desired phase difference, a smaller charge is placed on capacitor C1. The smaller charge on capacitor C1 causes the output of multiplier 410 to ramp down, and comparator 412 produces a pulse output to the R input of latch 414 earlier than occurred in a previous cycle of phase P1. The earlier initiation of the discharge portion of the cycle of phase P1 shortens the period of the cycle for phase P1, thereby increasing the phase difference between phases P1 and P2.

The above-described operation of controlling a phase difference between phases P1 and P2 also applies to controlling the phase difference between phases P2 and P3, and between phases P3 and P1. Accordingly, if each of oscillators 1, 2 and 3 has different frequencies when free running, by matching a phase difference between each of phases P1, P2 and P3, the frequencies of oscillators 1, 2 and 3 tend to change toward a frequency representative of an average of the free running frequencies produced by oscillators 1, 2 and 3. This feature is illustrated in multiphase oscillator 500 having differing values for each of capacitors 404, 430 and 454, to ensure each phase has a free running frequency that is different from those of the other phases. The synchronization of the three phases to a single frequency illustrates how the concept of the present invention operates to cover a broad range of frequency capture.

Another way to view the control mechanism for phases P1, P2 and P3, is to note that manipulation of the peak values reached during the charging portion of the cycle for each phase is adjusted to modify the cycle period, and therefore the phase difference between the phases.

Figure 12:
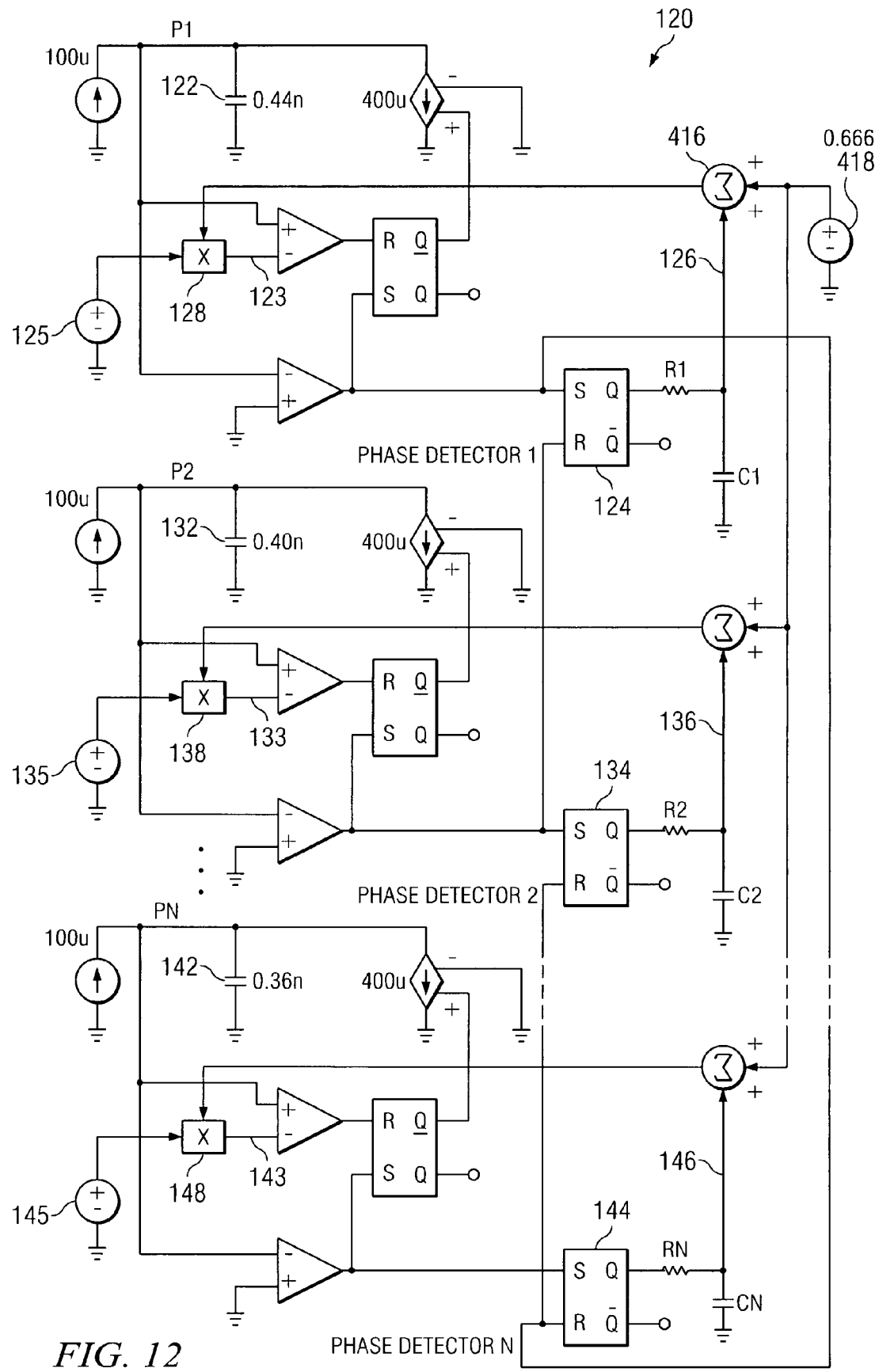
FIG. 12 is a circuit block diagram illustrating a synchronized oscillator having a generalized number of phases.

Referring now to FIG. 12, a multiphase oscillator 120 for N phases is illustrated. Each oscillator phase P1-PN operates by charging and discharging a respective capacitor 122, 132 or 142 between 0v and a threshold voltage 123, 133 or 143. Pairs of phases have a phase detector 124, 134 or 144 coupled therebetween for obtaining an indication of phase separation. Phase detectors 124, 134 and 144 operate by measuring an interval between a first phase start point and a second phase start point. The output of phase detectors 124, 134 and 144 include an RC network that produces a voltage value 126, 136 or 146 that is dependent upon the phase angle separation. Voltage values 126, 136 or 146 are summed with a reference voltage 121 that has a value dependent upon the number of phases N of 1−1/N. The result of the summing operation is applied to a multiplier 128, 138 or 148 for the given phase, which adjusts threshold voltages 123, 133 or 143 that serve as one of the charging limits for oscillator capacitor 122, 132 or 142, respectively. Accordingly, the frequency of oscillator phases P1-PN is adjusted with threshold voltages 123, 133 or 143, which threshold voltages change as a result of phase angle separations that vary from a desired phase angle separation.

Because each phase detector 124, 134 and 144 is coupled between two phases, the frequency of each phase is adjusted in relation to another phase. As each periodic waveform reflecting the charge on capacitors 122, 132 or 142 in each phase of the multiphase oscillator reaches 0v and begins another cycle, the period and phase separation information is propagated through the other phases to continue the phase separation adjustment and control. Eventually, the phases all settle toward a common frequency, which tends to be an average of the independent frequencies of all the phases.

The phases may be coordinated and caused to settle to a particular frequency that can be adjusted with an offset to reference voltage 125, 135 and 145. Other offsets or adjustments may be made to maintain a desired overall frequency for the multiphase oscillator.

Figure 13:
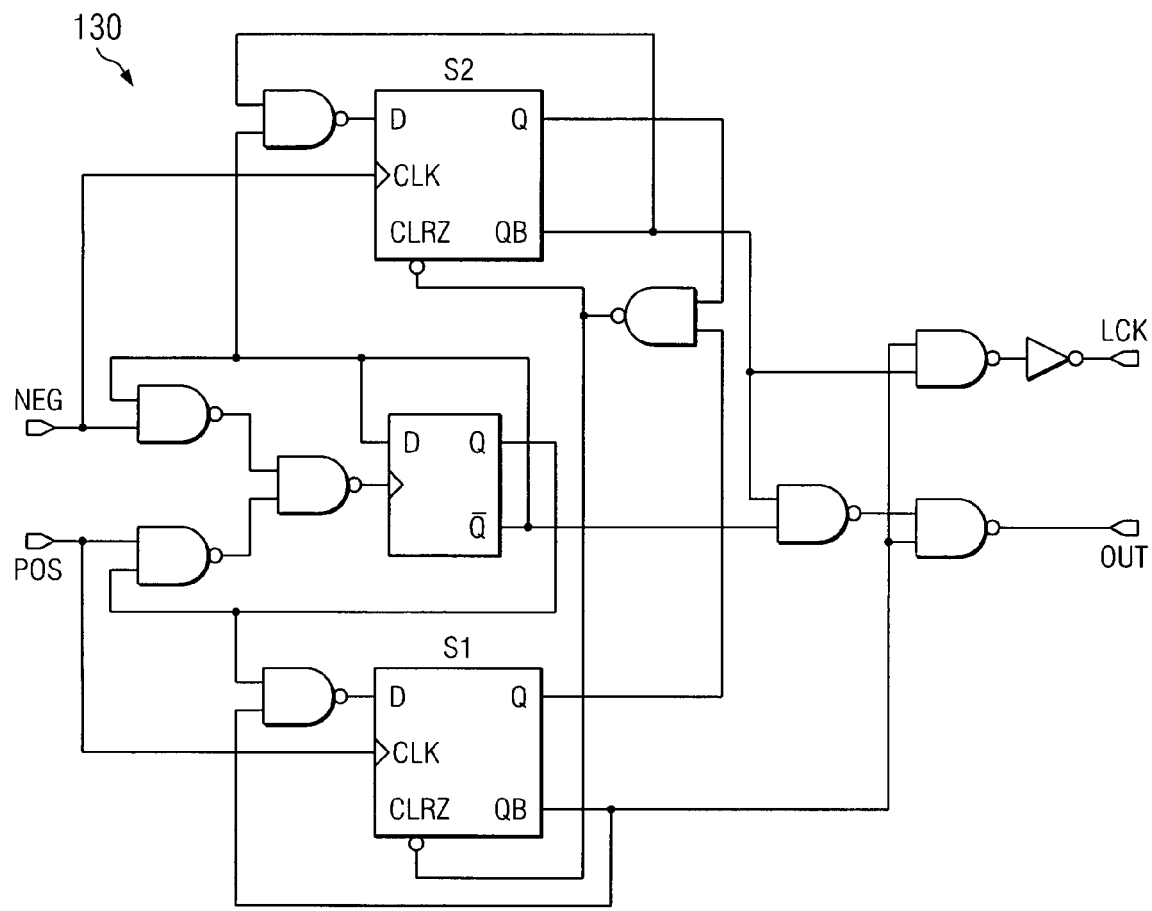
FIG. 13 is a circuit block diagram illustrating an implementation of a phase detector in accordance with an embodiment of the present invention.
Figure 14:
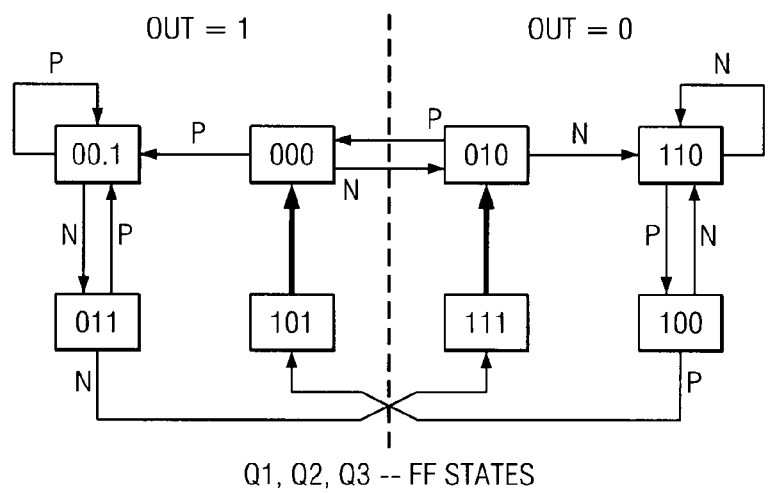
FIG. 14 shows a state diagram for operation of the phase detector of FIG. 13.

Referring now to FIG. 13, another example of a phase detector 130 is illustrated. Phase detector 130 has two inputs, NEG and POS and an output OUT that transitions high on a rising edge of POS and transitions low on a rising edge of NEG. A lock output LCK indicates when the frequency of inputs NEG and POS are equal. Once a lock is achieved, with equal frequency inputs, output OUT can transition with two simultaneous edges of NEG and POS, and the frequency lock is maintained. Referring to FIG. 14, a state diagram for phase detector 130 of FIG. 13 is illustrated.

The above-described multiphase oscillator provides a system and method for synchronizing oscillators without the need of a master-slave relationship. The disclosed concept of synchronizing the frequency in two or more phases is implemented with oscillators that are not dependent upon each other for a fixed or reference timing sequence. A universal multiphase oscillator results, with no master phase or master frequency, and no slave phase(s). The concept extends generally to two or more phases without limit.

In general, multiple phases are used to coordinate with each other to produce a single unified frequency. As oscillator frequency changes, or as a desired frequency result changes, the various channels, or phases, continue to synchronize with each other to correct for phase difference mismatches. In general, the resulting frequency is an average of the various frequencies in the various phases. The disclosed system and method synchronizes n oscillators at 360°/n phase separation, and is applicable for any type of oscillation source. The synchronized multiphase oscillator may be applied in any application using multiple variable synchronized frequencies, for example.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A synchronized multiphase oscillator, comprising:
a first oscillator providing a first periodic waveform;
a second oscillator providing a second periodic waveform;
a phase angle detector coupled to the first and second oscillators and operable to detect an operational phase angle difference between the first periodic waveform and the second periodic waveform and produce an indication related to a difference between the operational phase angle difference and a predetermined phase angle difference; and
a first and second period length adjustor coupled to the first and second oscillator, respectively and being responsive to the indication to influence a period length of the first and second periodic waveforms to urge the operational phase angle difference toward the predetermined phase angle difference.

2. The oscillator according to claim 1, wherein the phase angle detector is a flip-flop.

3. The oscillator according to claim 1, wherein the first and second oscillators are variable frequency oscillators.

4. The oscillator according to claim 3, wherein the oscillators are voltage controlled oscillators (VCOs).

5. The oscillator according to claim 3, further comprising a minimum period limiter to provide a maximum frequency limit.

6. The oscillator according to claim 1, further comprising a low pass filter interposed between the phase angle detector and one or more of the first and second period length adjustors.

7. The oscillator according to claim 1, wherein the indication is proportional to the difference between the operational phase angle difference and the predetermined phase angle difference.

8. The oscillator according to claim 6, further comprising a constant summed with an output of the low pass filter to produce the indication.

9. A multiphase oscillator, comprising:
a first oscillator producing a first periodic waveform;
a second oscillator producing a second periodic waveform;
a phase angle difference detector coupled to the first and second oscillator and being reset at a predetermined point in each cycle of the first and second periodic waveform, such that an interval between resets determines a phase angle between the predetermined points in the first and second waveforms; and
a period length adjuster coupled to one of the first or second oscillators and being operable to adjust a period length of a respective one of the first or second waveforms based on the determined phase angle in relation to a predetermined phase angle to urge the determined phase angle toward the predetermined phase angle.

10. The oscillator according to claim 9, wherein the phase angle difference detector is a flip-flop.

11. The oscillator according to claim 9, wherein the first and second oscillators are variable frequency oscillators.

12. The oscillator according to claim 11, wherein the first and second oscillators are voltage controlled oscillators (VCOs).

13. The oscillator according to claim 11, further comprising a minimum period limiter to provide a maximum frequency limit.

14. The oscillator according to claim 9, further comprising a low pass filter interposed between the phase angle difference detector and the period length adjustor.

15. The oscillator according to claim 9, wherein the period length adjuster further comprises a converter to convert the interval to a phase adjustment signal that is proportional to the difference between the determined phase angle and the predetermined phase angle.

16. The oscillator according to claim 14, further comprising a constant summed with an output of the low pass filter to produce a signal that is applied to the first or second oscillator to adjust the period length.

17. A method for synchronizing phases in an oscillator having a plurality of interleaved phases having periodic waveforms, the method comprising:
generating a plurality of periodic signals to form the periodic waveforms;
generating an indication of a phase angle difference between the periodic waveforms in a pair of phases; and
controlling generation of both periodic waveforms in the pair of phases to form a desired phase angle difference between the periodic waveforms in response to the indication.

18. The method according to claim 17, further comprising controlling generation of the periodic waveforms with variable switching frequency.

19. The method according to claim 18, further comprising controlling generation of the periodic waveforms to have a minimum period.

20. A multiphase oscillator, comprising:
a first oscillator having a first switch being switched in accordance with a first and second control signal to form a first periodic waveform;
a second oscillator having a second switch being switched in accordance with a third and fourth control signal to form a second periodic waveform;
a phase detector operable to produce a indication having a value determined by an interval from an assertion of the first or second control signal to an assertion of the third or fourth control signal, such that the value determines a phase angle difference between the first and second periodic waveform; and
a first and second period length adjuster coupled to the first and second oscillator, respectively, and being operable to produce a period adjustment signal to influence a period length of the first and second periodic waveforms, respectively, based on the indication value in relation to a predetermined value representative of a specified phase angle difference.

21. A multiphase oscillator, comprising:
a first oscillator having a first switch being switched in accordance with a first and second control signal to form a first periodic waveform;
a second oscillator having a second switch being switched in accordance with a third and fourth control signal to form a second periodic waveform;
a phase detector operable to produce an indication having a value determined by an interval between predetermined points in each cycle of the first and second periodic waveforms, such that the value determines a phase angle difference between the first and second periodic waveforms; and
a period length adjuster coupled to one of the first or second oscillators and being operable to produce a period adjustment signal to influence a period length of a respective one of the first or second periodic waveforms based on the indication value in relation to a predetermined value representative of a specified phase angle difference.

22. A computer-program product comprising:
a computer-readable medium having computer program code embodied thereon for synchronizing phases in an oscillator having a plurality of phases, the computer program code adapted to:
generate a plurality of periodic signals to form the periodic waveforms;
generate an indication of a phase angle difference between the periodic waveforms in a pair of phases; and
control generation of both periodic waveforms in the pair of phases to form a desired phase angle difference between the periodic waveforms in response to the indication.

* * * * *